United States Patent
Freitag et al.

(10) Patent No.: US 7,522,391 B2
(45) Date of Patent: Apr. 21, 2009

(54) CURRENT PERPENDICULAR TO PLANE MAGNETORESISTIVE SENSOR HAVING A SHAPE ENHANCED PINNED LAYER AND AN IN STACK BIAS STRUCTURE

(75) Inventors: James Mac Freitag, Sunnyvale, CA (US); Kuok San Ho, Santa Clara, CA (US); Mustafa Michael Pinarbasi, Morgan Hill, CA (US); Ching Hwa Tsang, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 411 days.

(21) Appl. No.: 11/304,219

(22) Filed: Dec. 14, 2005

(65) Prior Publication Data

US 2007/0133133 A1    Jun. 14, 2007

(51) Int. Cl.
  *G11B 5/39* (2006.01)
(52) U.S. Cl. ................................. 360/324.12
(58) Field of Classification Search ........... 360/324.11, 360/324.12, 324.2, 317, 327.31, 321, 319
See application file for complete search history.

(56) References Cited

U.S. PATENT DOCUMENTS

| | | | |
|---|---|---|---|
| 5,546,253 A | 8/1996 | Che .......................... 360/113 |
| 5,576,914 A | 11/1996 | Rottmayer et al. .......... 360/113 |
| 5,668,473 A | 9/1997 | Van Den Berg ............. 324/252 |
| 6,002,553 A | 12/1999 | Stearns et al. ............... 360/113 |
| 6,421,212 B1 * | 7/2002 | Gibbons et al. ........ 360/327.31 |
| 6,466,419 B1 * | 10/2002 | Mao ....................... 360/324.12 |
| 6,487,056 B1 * | 11/2002 | Gibbons et al. ........ 360/327.31 |
| 6,671,139 B2 * | 12/2003 | Carey et al. ............ 360/324.12 |
| 6,757,144 B2 * | 6/2004 | Carey et al. ............... 360/324.2 |
| 6,762,915 B2 | 7/2004 | Pokhil et al. ........... 360/324.11 |
| 7,057,859 B2 * | 6/2006 | Kagami et al. ............... 360/317 |
| 7,310,208 B2 * | 12/2007 | Hasegawa et al. ...... 360/324.11 |
| 2003/0086216 A1 | 5/2003 | Kagami et al. ........... 360/324.2 |
| 2003/0179520 A1 | 9/2003 | Hasegawa ............... 360/324.12 |
| 2004/0114284 A1 | 6/2004 | Rachid et al. .......... 360/324.11 |
| 2004/0207959 A1 | 10/2004 | Saito ........................ 360/324.1 |
| 2004/0207960 A1 | 10/2004 | Saito et al. ............... 360/324.1 |
| 2004/0207962 A1 | 10/2004 | Saito et al. ............... 360/324.1 |
| 2005/0128652 A1 | 6/2005 | Freitag et al. .......... 360/324.11 |
| 2005/0219772 A1 * | 10/2005 | Hayashi et al. .......... 360/324.2 |

FOREIGN PATENT DOCUMENTS

| JP | 2000187812 | 7/2000 |
|---|---|---|
| JP | 2003077107 | 3/2004 |

OTHER PUBLICATIONS

Office Action Summary Translation from Chinese Application No. 200610166778.5 received on Dec. 1, 2008.

\* cited by examiner

*Primary Examiner*—Tianjie Chen
(74) *Attorney, Agent, or Firm*—Zilka-Kotab, PC

(57) ABSTRACT

A magnetoresistive sensor having an in stack bias structure and a pinned layer having shape enhanced anisotropy. The sensor may be a partial mill design wherein the track width of the sensor is defined by the width of the free layer and the pinned layers extend beyond the trackwidth of the sensor. The sensor has an active area defined by the stripe height of the free layer. The pinned layer extends beyond the stripe height defined by the free layer, thus providing the pinned layer with the shape enhanced anisotropy. The pinned layer structure can be pinned by exchange coupling with a layer of antiferromagnetic material (AFM) layer, with pinning robustness being improved by the shape enhanced anisotropy, or can be a self pinned structure which is pinned by a combination of magnetostriction, AP coupling and shape enhanced anisotropy.

21 Claims, 24 Drawing Sheets

CURRENT PERPENDICULAR TO PLANE MAGNETORESISTIVE SENSOR HAVING A SHAPE ENHANCED PINNED LAYER AND AN IN STACK BIAS STRUCTURE

FIELD OF THE INVENTION

The present invention relates to magnetoresistive sensors and more particularly the construction of a current perpendicular to plane magnetoresistive sensor having an in stack bias structure and a pinned layer that is extended in the stripe height direction to increase shape induced magnetic anisotropy and thereby improve pinning.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos $\Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The push for ever increased data rate and data capacity has lead a drive to make magnetoresitive sensors ever smaller. For example, designing a sensor with a narrower track width means that more tracks of data can be fit onto a given area of magnetic medium. The various dimensions of a sensor must scale together, so if the trackwidth is decreased, then the stripe height dimension (perpendicular to the ABS) must also be decreased. As sensors become ever smaller, one problem that arises is that the pinned layer becomes impracticably unstable. In fact, future generation sensor will very soon become so small that the pinned layer will not be capable of being pinned by current pinning mechanisms. This has to do with the size of the pinned layer, which makes the pinned layer itself hard to pin, as well as the reduced area on which traditional pinning mechanisms such as AFM pinning, AP coupling, and magnetostriction induced anisotropy can act.

Therefore, pinning stability of the sensor is one of the key concerns for higher areal recording density. This is especially true for current perpendicular to plane sensors such as current perpendicular to plane giant magnetoresistive (CPP GMR) and magnetic tunnel junction (MTJ) structures where the sensor dimensions will be 50 nm or below. CPP GMR sensors and MTJ sensors are of special interest, due to their capacity for higher signal amplitude. As mentioned above pinning strength deteriorates as the sensor dimensions get smaller. Furthermore, thinner sensor structures such as self pinned sensors are becoming more important, because of the drive to decrease gap thickness to decrease bit length. Therefore, pinning improvement for pinned and self pinned sensors is essential.

SUMMARY OF THE INVENTION

The present invention provides a current perpendicular to plane magnetoresistive sensor having both an in-stack bias structure and a shape enhance pinned layer. The sensor includes a free layer, a pinned layer and either an electrically conductive spacer layer or an electrically insulating barrier layer sandwiched between the free layer and the pinned layer. The sensor has a surface intended for facing a magnetic medium during use (air bearing surface (ABS)). The free layer extends from the ABS to a first stripe height. The pinned layer, however, extends significantly beyond the first stripe height to terminate at a second stripe height that is further from the ABS than the first stripe height. The in-stack bias structure is formed adjacent to the free layer, opposite the spacer/barrier layer.

Extending the pinned layer in the stripe height direction advantageously results in a strong magnetic anisotropy in a direction perpendicular to the ABS. This anisotropy, which can be several hundred Oe, greatly enhances pinning.

The in stack bias structure advantageously eliminates the need for hard bias layer at the sides of the sensor and results in improved, uniform free layer biasing.

The sensor can include a pinned layer that is either self pinned or pinned by exchange coupling with a layer of anti-ferromagnetic material AFM layer. If a self pinned pinned layer is used, the shape enhanced anisotropy maintains strong pinning, even without the use of an AFM layer. If the sensor is AFM pinned, the anisotropy prevents the setting of the AFM of the in-stack bias structure from affecting the pinning of the pinned layer.

The sensor can also be embodied in a full mill sensor or in a partial mill sensor design in which only the free layer and in-stack bias structure are removed during the track width defining ion mill.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
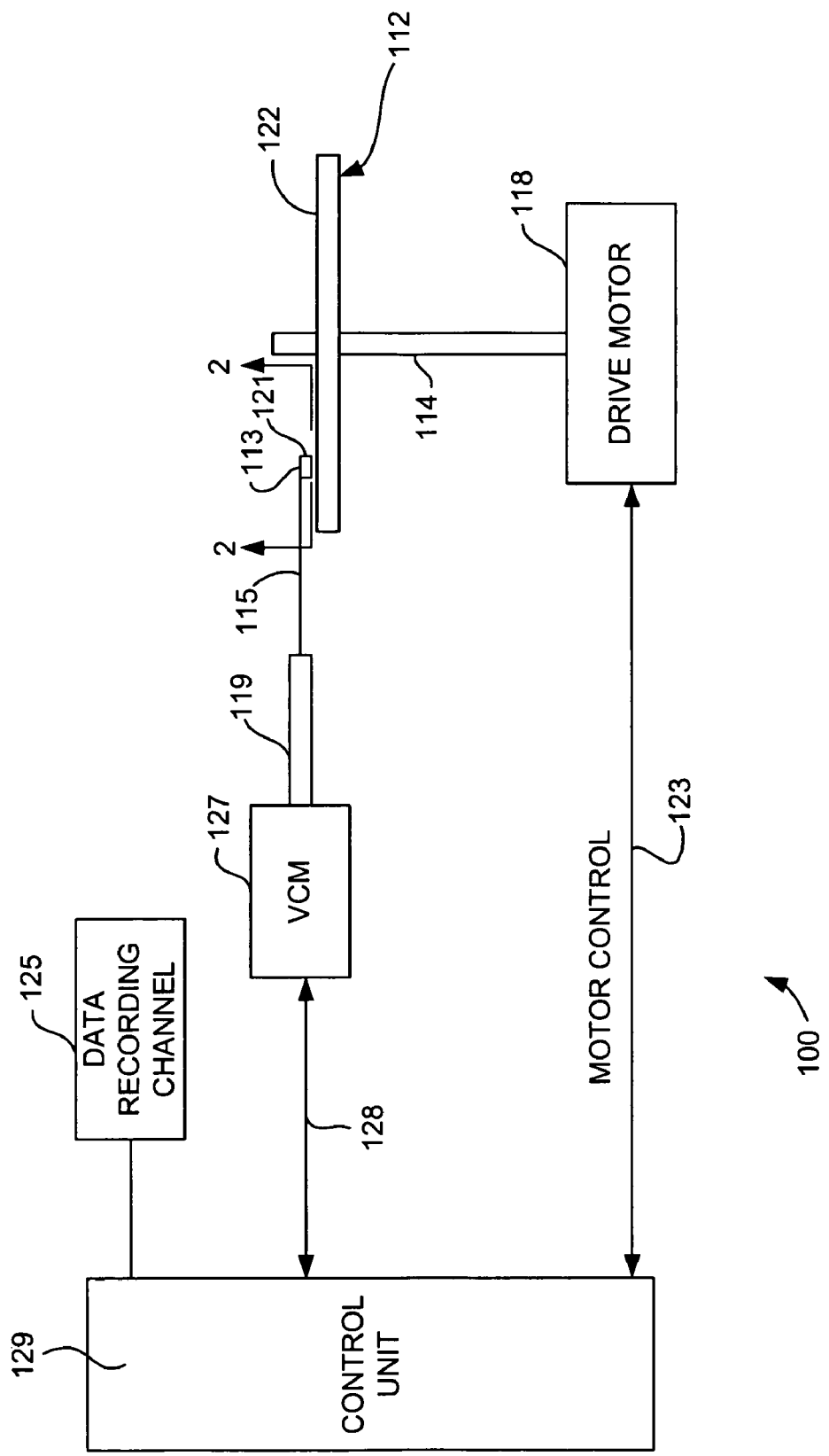
FIG. 1 is a schematic illustration of a disk drive system in which the invention might be embodied.

Referring now to FIG. 1, there is shown a disk drive 100 in which the present invention may be embodied. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
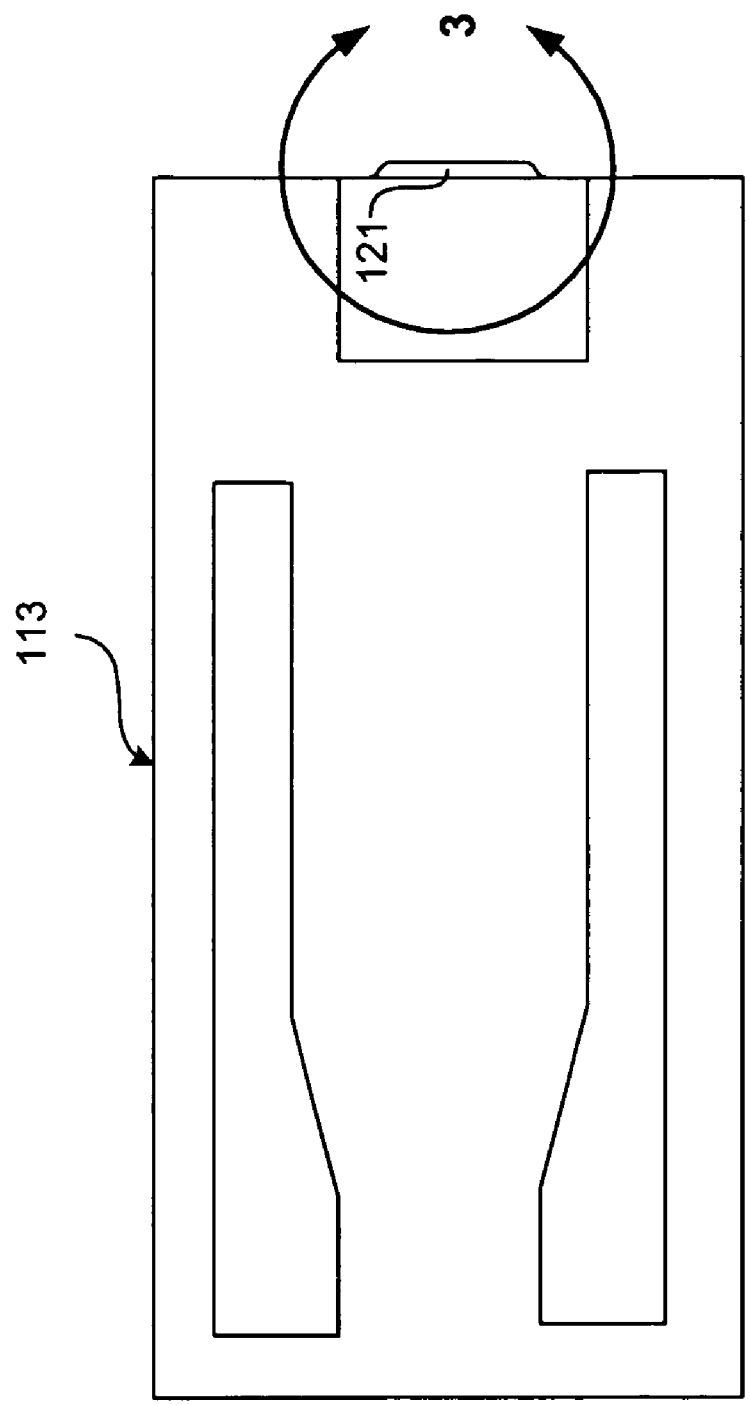
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

With reference now to FIG. 3, a magnetoresistive sensor 300 according to an embodiment of the invention includes a magnetoresistive sensor element or sensor stack 302, sandwiched between first and second electrically conductive lead layers 304, 306, which can be constructed of a magnetic material such as NiFe so that they serve as magnetic shields as well as electrical leads. Alternatively, the leads 304, 306 can be constructed of a non-magnetic material such as Au, Cu or some other electrically conductive material. An electrically insulating fill layer 305, 307 is provided at the sides of the sensor stack 302. The fill layers 305, 307 can also be constructed of a magnetic material such as NiFe, however, if an electrically conductive material is used for the fill layer 305, then a layer of insulation layer will be needed, both at the sides of the sensor stack 302 and across the surface of at least one of the leads 304, 306 to prevent current from shunting through the fill layer 305.

The sensor stack 302 includes a magnetic free layer 312, a pinned layer structure 314 and a non-magnetic, electrically conductive spacer layer 316, constructed of, for example Cu, sandwiched between the free layer 312 and the pinned layer 314. The invention could also be embodied in a tunnel valve sensor in which case the layer 302 would be a thin, non-magnetic, electrically insulating barrier layer. The free layer 312 can be constructed of several magnetic materials such as Co or CoFe, or of a combination of layers of different magnetic materials.

Figure 3A:
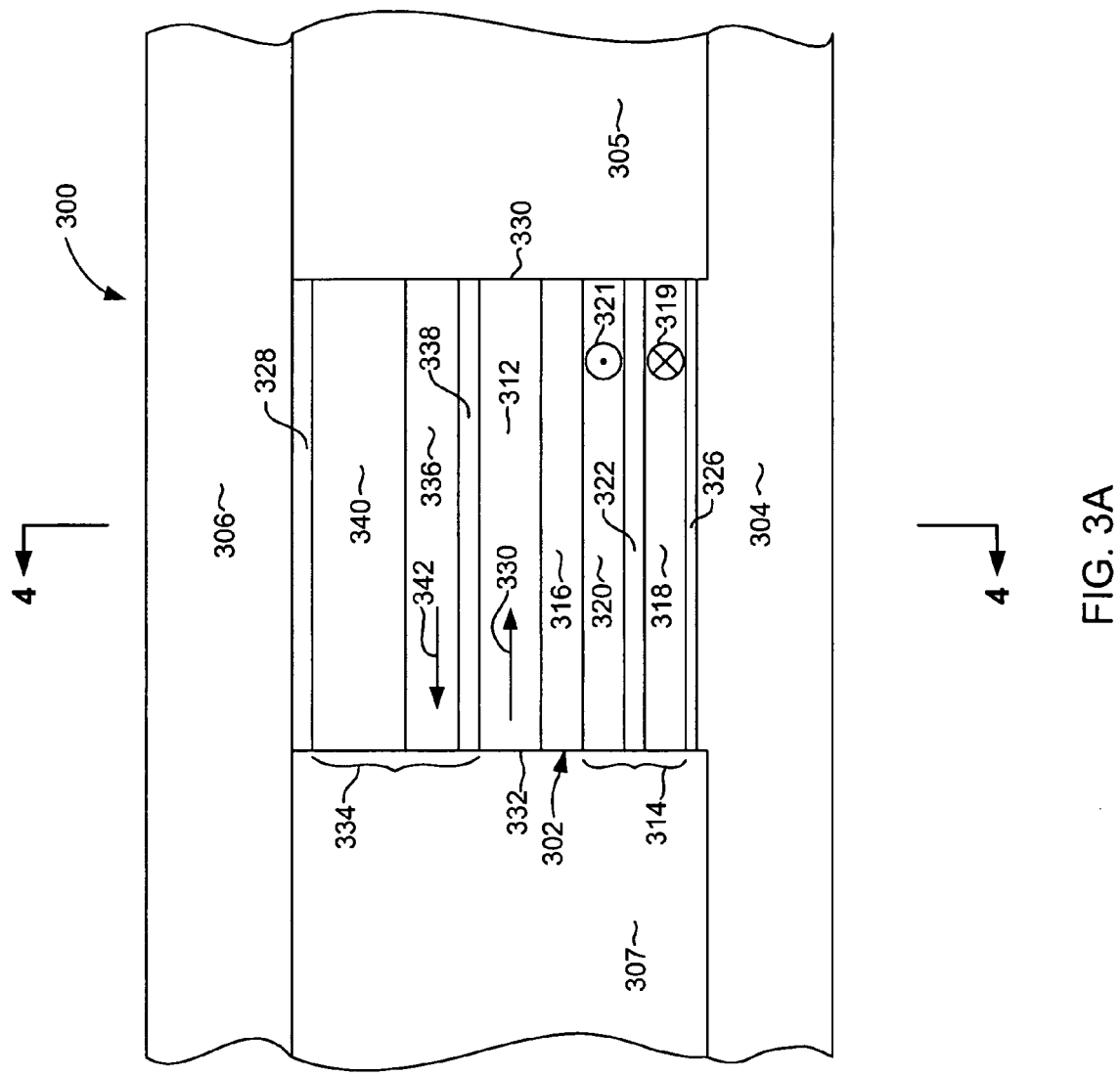
FIG. 3A is an ABS view, taken from circle 3 of FIG. 2 illustrating a sensor according to an embodiment of the invention.

The pinned layer structure 314 used in the embodiment described in FIG. 3A is an AP pinned, self pinned structure. The pinned layer structure 314 includes a first magnetic layer AP1 318, a second magnetic layer AP2 320, and an AP coupling layer 322 sandwiched between the AP1 and AP2 layers. The coupling layer 322 can be for example Ru and is of such a thickness to strongly antiparallel couple the magnetic moments 319, 321 of the AP1 and AP2 layers 318, 320. AP1 and AP2 layers are constructed of a material having a positive magnetostriction, such as for example CoFe. This positive magnetostriction, when combined with the compressive stresses that are inevitably present in thin film magnetoresistive sensors, causes a strong magnetic anisotropy in a direction perpendicular to the ABS. This magnetic anisotropy, when combined with the antiparallel (AP) coupling of the AP1 and AP2 layers 318, 320 assists in the pinning of the magnetic moments 319, 321 of the AP1 and AP2 layers 318, 320. The pinning strength of the self pinned structure 314 is also greatly enhanced by a shape enhanced anisotropy that will be described further below with reference to FIG. 4. As a self pinned sensor 314, pinning can be maintained without the need for an AFM layer. The removal of the AFM layer results in large reduction in gap thickness, since AFM layers such as PtMn and IrMn must be very thick in order to function effectively as AFM layers.

The sensor stack 302 also may include a seed layer 326 formed at the bottom of the sensor stack 302, which can be used to initiate a desired crystalline growth in the layers of the sensor stack 302. A capping layer 328, such as for example Ta or some other suitable material may be provided at the top of the sensor stack 302 to protect the layers of the sensor stack from damage during manufacturing processes such as annealing. The sensor stack 302 has first and second lateral sides 330, 332 that define the track width (TW) of the sensor. The free layer 312 has a magnetic moment 330 that is biased in a desired direction parallel with the ABS.

Biasing of the moment 330 is achieved by a bias field provided by an in stack bias structure 334. The in stack bias structure can be of several designs, and preferably includes a magnetic bias layer 336, that is separated from the free layer by a non-magnetic spacer layer 338. The bias layer 336 may be exchange coupled with a layer of antiferromagnetic material (AFM layer) 340. The bias 336 layer is constructed of a magnetic material such as Co, CoFe, NiFe, etc. The spacer layer 338 may be for example Ru and is of such a thickness to magnetostatically couple the bias layer 336 with the free layer 312. The AFM layer 340 can be constructed of, for example PtMn, IrMn or some other antiferromagnetic material, and is of such a thickness to exchange couple with the bias layer 336 and, thereby, strongly pin the moment 342 of the bias layer 336.

Figure 4:
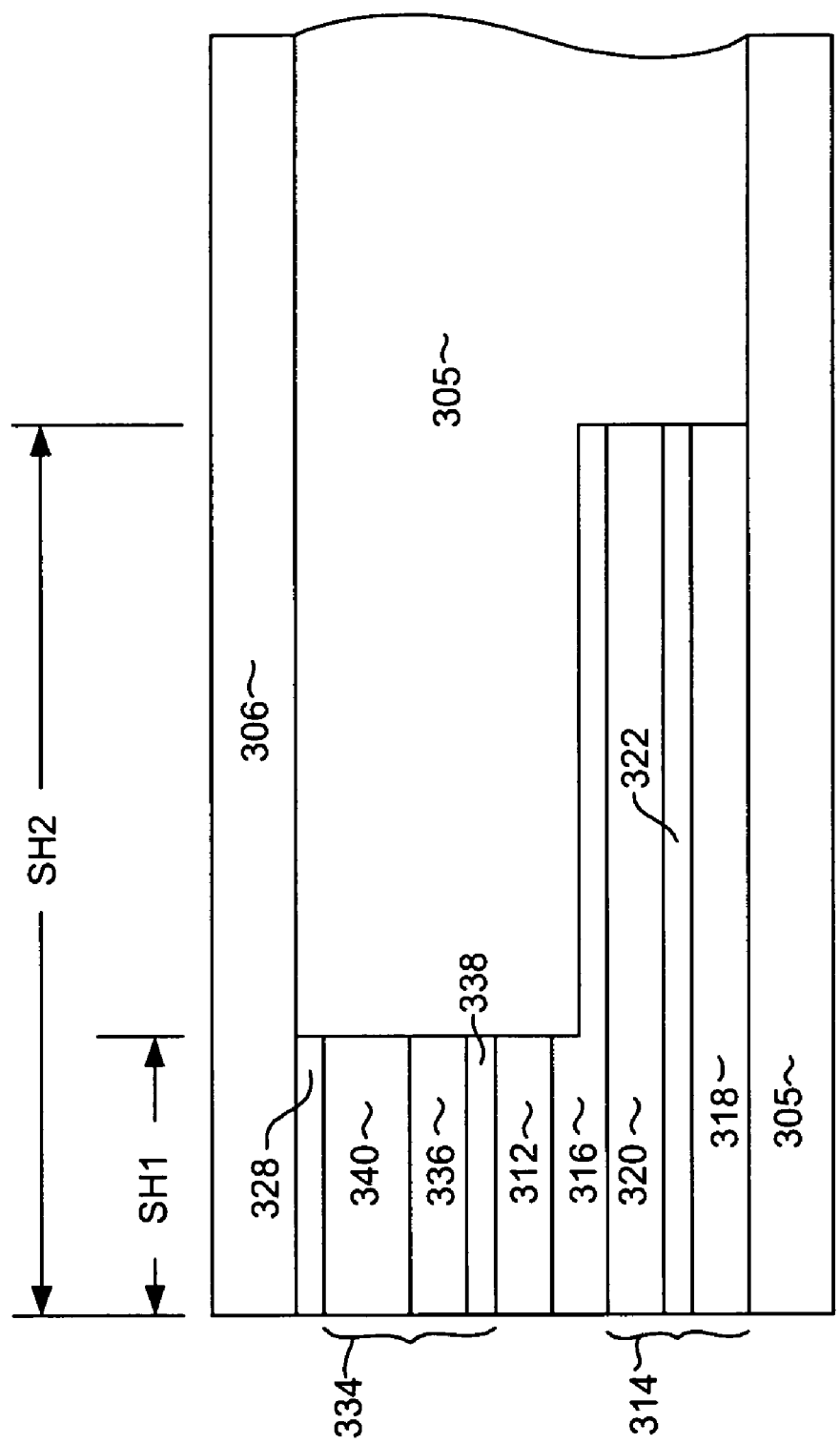
FIG. 4 is a side cross sectional view, taken from line 4-4 of FIG. 3.

With reference to FIG. 4, it can be seen that the free layer 312, and the in stack bias structure extend from the ABS a first stripe height distance SH1, whereas the pinned layer 314 and possibly a portion of the spacer layer 316 extend much further from the ABS to a second stripe height distance SH2. SH2 is preferably at least twice SH1 and may be several times SH1 (such as at least two times SH1). SH2 is at least larger than SH1. It should be pointed out that the term ABS (or air bearing surface) refers to the surface of the sensor 300 that faces the magnetic medium during use. As fly heights become ever smaller, there may soon come a point where it will be difficult to distinguish whether the head is flying or in contact with the medium. Therefore, ABS should be understood to refer to the medium facing surface of the head, regardless of the fly height.

The pinned layer 314, being extended in the stripe height direction as described, has a strong shape enhanced magnetic anisotropy. This shape enhanced anisotropy can be several hundred Oe, greatly enhancing the pinning strength. This shape enhanced pinning allows the pinned layer 314 to be constructed as a self pinned sensor (pinned without the use of an AFM layer. Eliminating the AFM pinning layer, allows an optimal AFM material 340 to be used in the in stack bias structure 334, without concern for setting (annealing) two different AFM layers. In addition to the shape enhanced anisotropy, pinning of the pinned layer 314 is also maintained by the positive magnetostriction of the AP1 and AP2 layers 318, 320, and by the AP coupling of the layers 318, 320, as discussed above.

Figure 3B:
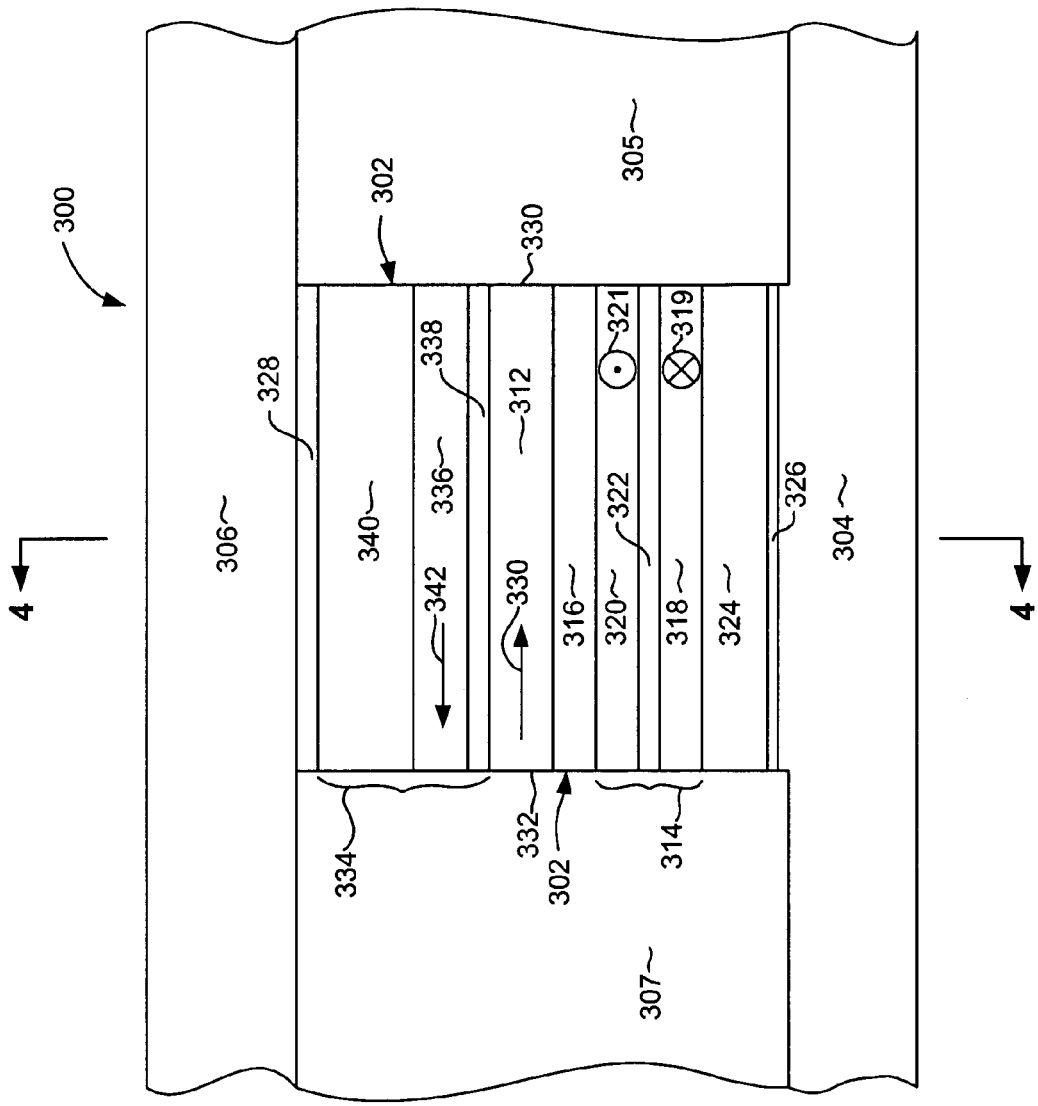
FIG. 3B is an ABS view, similar to FIG. 3A illustrating a sensor according to an alternate embodiment of the invention.

With reference to FIG. 3B, the invention could be embodied in a sensor 300 having an AFM pinned structure. Such a sensor 300 would include a pinned layer 314 with an AP1 layer 318 that is exchange coupled with a layer of antiferromagnetic material (AFM layer) 324.

Figure 5A:
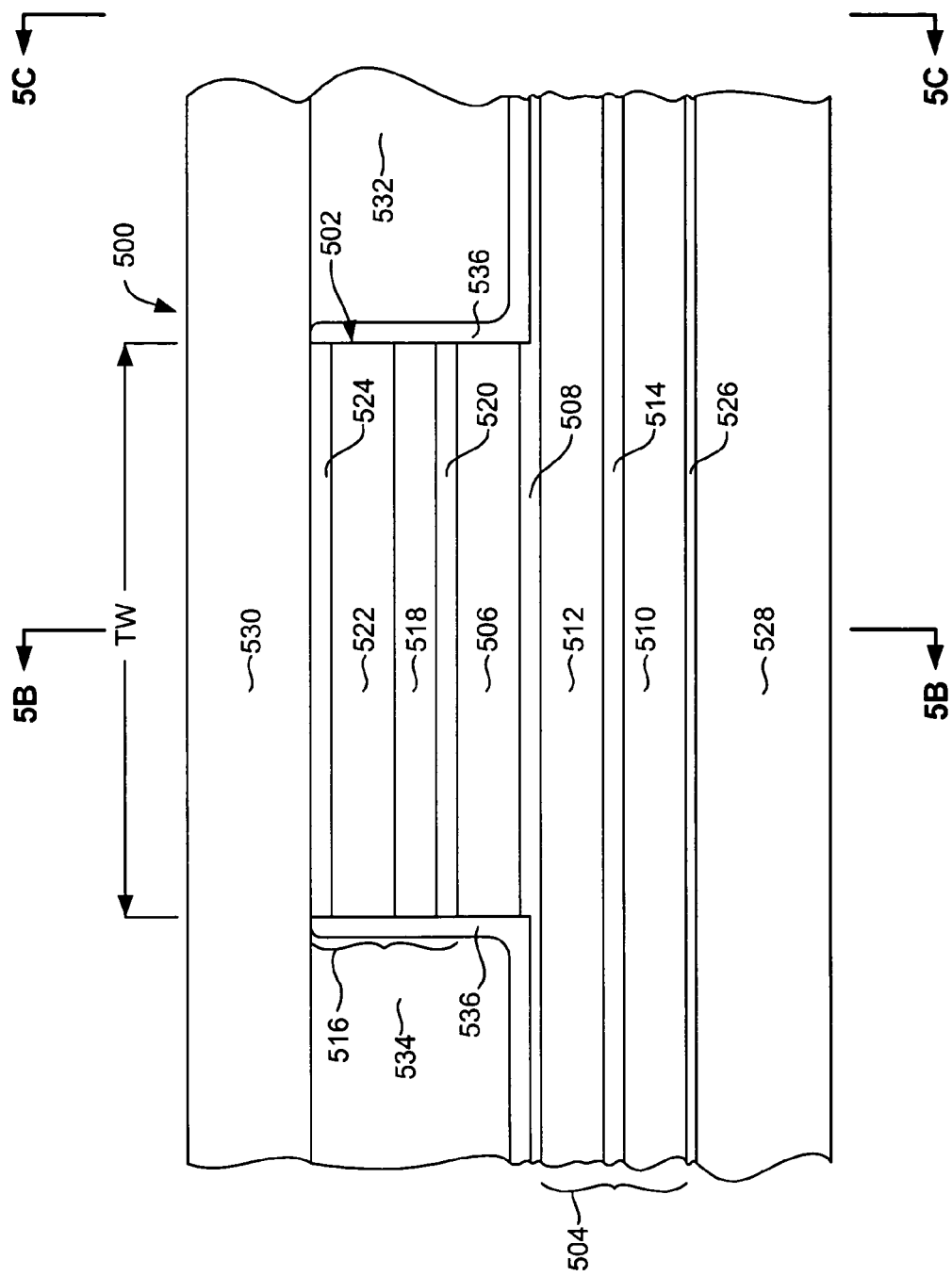
FIG. 5A is an ABS view of a sensor according to an embodiment of the invention.

With reference to FIG. 5A, in an alternate embodiment of the invention, the sensor 500 has a partial mill design. The sensor 500 includes a sensor stack 502, having a pinned layer structure 504, a free layer 506 and a non-magnetic, electrically conductive spacer layer 508, constructed of, for example Cu. The invention could also be embodied in a tunnel valve sensor in which case the layer 508 would be a thin, non-magnetic, electrically insulating barrier layer. The free layer 506 can be constructed of a magnetic material such as Co, CoFe, CoFeB, NiFe or a combination of these materials.

The pinned layer 504 is preferably an antiparallel coupled (AP coupled) structure including a first magnetic layer (AP1) 510, a second magnetic layer (AP2) 512 and an AP coupling layer 514 sandwiched between the AP1 and AP2 layers. The AP1 and AP2 layers 510, 512 can be constructed of a magnetic material having a positive magnetostriction to assist pinning, such as for example CoFe. The AP coupling layer 514 can be constructed of Ru.

The sensor stack 502 also includes an in stack bias structure 516. The in stack bias structure includes a magnetic biasing layer 518, a non-magnetic spacer layer 520 and a layer of antiferromagnetic material (AFM layer) 522. The magnetic bias layer 518 can be constructed of, for example, Co, CoFe, NiFe, etc. The spacer layer 520 can be constructed of, for example Ru, Cu or some other electrically conductive, non-magnetic material. The AFM layer 522 can be, for example, PtMn or IrMn. In addition, the sensor stack 502 may have a cap layer 524, such as Ta to protect the sensor layers from damage during manufacture. A seed layer 526, may also be provided at the bottom of the sensor stack 502 to promote a desired epitaxial growth in the sensor layers.

The sensor stack 502 is sandwiched between first and second leads 528, 530. These leads 528, 530 are preferably constructed of a magnetic material such as NiFe so that they can function as magnetic shields as well as leads. In addition, first and second side shields 532, 534 may be provided at the sides of the sensor stack 502. These side shields 532, 534 are constructed of a magnetic material such a NiFe. A thin electrical insulation layer 536, such as conformally deposited alumina, is provided at either side of the sensor stack 502 and also extends across the surface of the extended portion of the sensor stack 502. This insulation layer 536 prevents sense current from being shunted through the electrically conductive side shields 532, 534. Alternatively, the side shields 532, 534 could be eliminated, and could be replaced with an electrically insulating fill layer (not shown).

With continued reference to FIG. 5A, it can be seen that the free layer extends to a first width to define a track width TW. The other layers, which may include the spacer layer 508 and all or a portion of the pinned layer 504, extend beyond the track width TW. Therefore, the trackwidth of the sensor 500 is defined by the width of the free layer 506. In this partial mill design, the laterally extending portion of the pinned layer 504 extends at least beyond the width of the free layer. The laterally extending portion of the free layer preferably extends to a width at least twice the width of the free layer, and more preferably extends indefinitely in the lateral direction.

To understand the advantages of this partial mill design it is necessary to understand the processes that are used to define the sensor stack. All of the sensor layers are first deposited full film, and then a mask having a width substantially equal to the track width TW is formed over the sensor layers. An ion mill is then used to remove sensor material not covered by the mask. Traditionally this ion mill has been performed sufficiently to remove all of the sensor material not covered by the mask down to the level of an underlying substrate such as the first lead (in the case of a CPP sensor) or first gap layer (in the case of a CIP) sensor.

As the ion mill process removes sensor material, a certain amount of this material becomes redeposited on the sides of the sensor. In a CIP sensor this redeposited material (redep) reduces the efficiency of the hard bias layers by increasing the distance between the hard bias layers and the free layer. In a CPP sensor this redepeposited material is much more problematic, because it shunts sense current, dramatically decreasing the performance of the sensor.

In the partial mill design described with reference to FIGS. 5A-5C, only the in stack bias layer 516 and free layer 506 are removed during the track width defining ion mill process. Ion milling is stopped when the barrier or spacer layer 316 is reached. The pinned layer 314 remains after ion milling, as well as the underlying leads 304. This greatly reduces the amount of redep because no pinned layer material or lead material is removed during the ion milling and cannot, therefore, be redeposited. A more detailed discussion of a method for constructing a sensor according to an embodiment of the invention will be provided below.

Figure 5B:
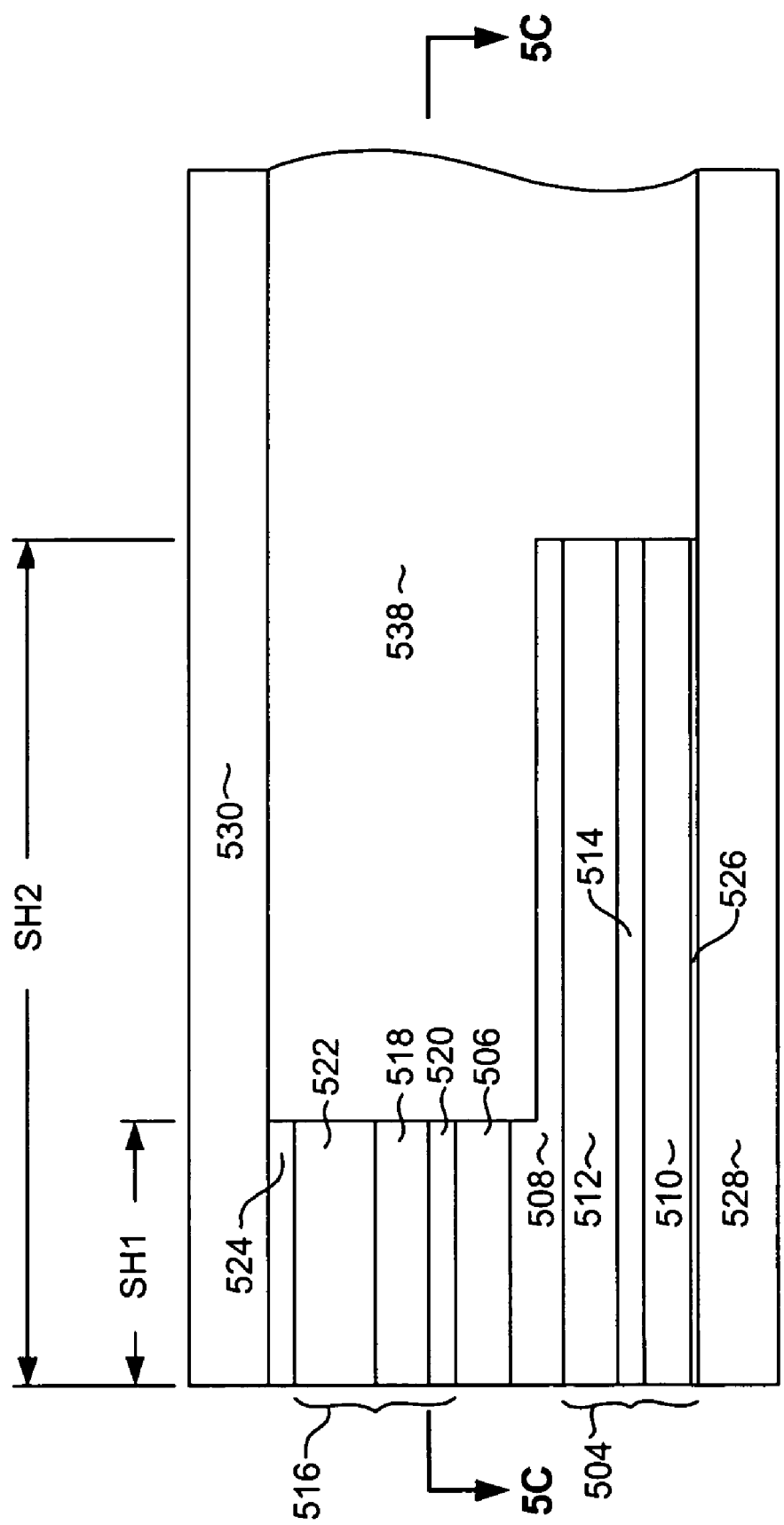
FIG. 5B is a sectional view taken from line 5B-5B of FIG. 5A.

With reference now to FIG. 5B, the free layer 506, in stack bias structure 516 and possibly a portion of the spacer layer 508 terminate at a first stripe height distance SH1 as measured from the ABS. The pinned layer structure extends significantly beyond the first stripe height SH1 to a second stripe height SH2, also measured from the ABS. The second stripe height distance SH2 is at least larger than the first stripe height distance SH1, and is preferably at least twice the first stripe height distance SH1. More preferably, the second stripe height distance is several times or three or more times the first stripe height distance. An electrically insulating, non-magnetic fill material 538, such as alumina, fills the space behind the free layer 506 and in stack bias structure 516.

Figure 5C:
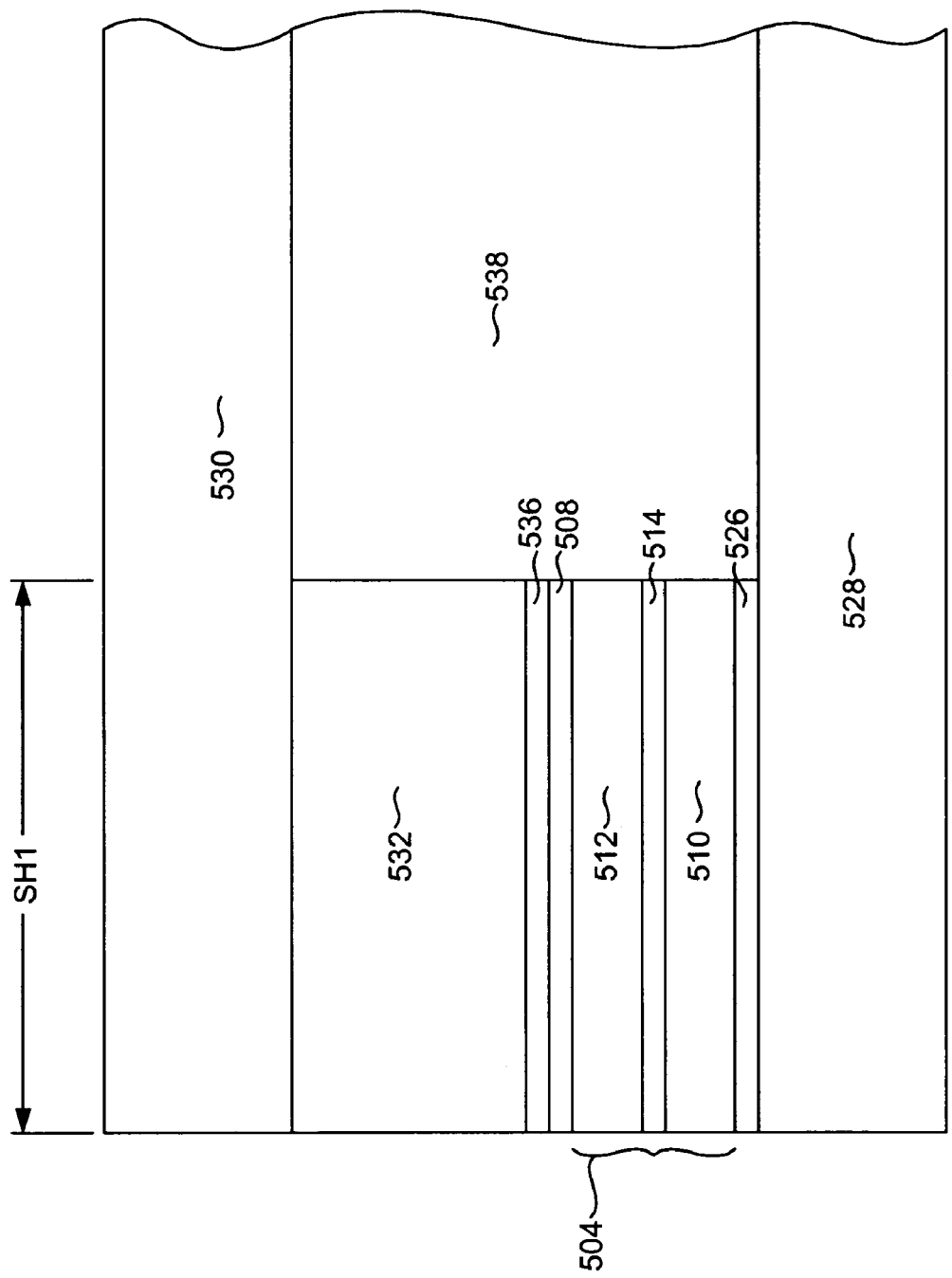
FIG. 5C is a sectional view taken from line 5C-5C of FIG. 5B.

With reference now to FIG. 5C, it can be seen that the laterally extended portion of the pinned layer structure 504, has a stripe height that terminates at the stripe height SH1, at the same stripe height as that of the free layer 506 and in stack bias structure 516 (shown in FIG. 5B). This stripe height SH1 of the pinned layer structure 504 is formed by a method that will be described herein below. Terminating the laterally extending portions of the pinned layer 504 at SH1 as shown improves the shape enhanced anisotropy of the pinned layer 504 and improves magnetic performance of the sensor 500.

Extending the pinned layer 504 beyond the stripe height SH1 of the sensor stack 502 to SH2 provides a very strong magnetic anisotropy in a direction perpendicular to the ABS. This shaped induced anisotropy is as high as several hundred Oe, assuring extremely strong pinning. Furthermore, this strong magnetic anisotropy is advantageously unaffected by other factors such as the size of the sensor or by mechanical stresses. What's more, this anisotropy is completely additive to other pinning mechanisms such as AP pinning, AFM pinning or pinning with a hard magnet.

With reference now to FIGS. 6-21 a novel manufacturing method is described. This method makes use of a single mask structure for multiple manufacturing processes, re-using a single mask structure so that multiple mask alignments are not necessary. It should be pointed out that while this recycled mask process is being described in terms of manufacturing the above described sensor structure, in a more general sense this multiple-use mask process can be used to construct many different structures including those other than read/write magnetic heads such as in semiconductor or integrated circuit designs. Furthermore, while the multiple-use mask process is described as using a single mask for two manufacturing processes the mask structure could be used more than two times for many multiple processes.

To illustrate the process with regard to the particular structure described above, with reference now to FIG. 6, a substrate, such as a first lead 602 is provided, on top of which the various sensor layers 604 are deposited as full film layers. Although shown as a single layer in FIG. 6, it will be understood that the layer 604 actually includes the various, multiple layers that make up the sensor stack 502 as described above, including the in stack bias structure 510 (FIG. 5).

Figure 6:
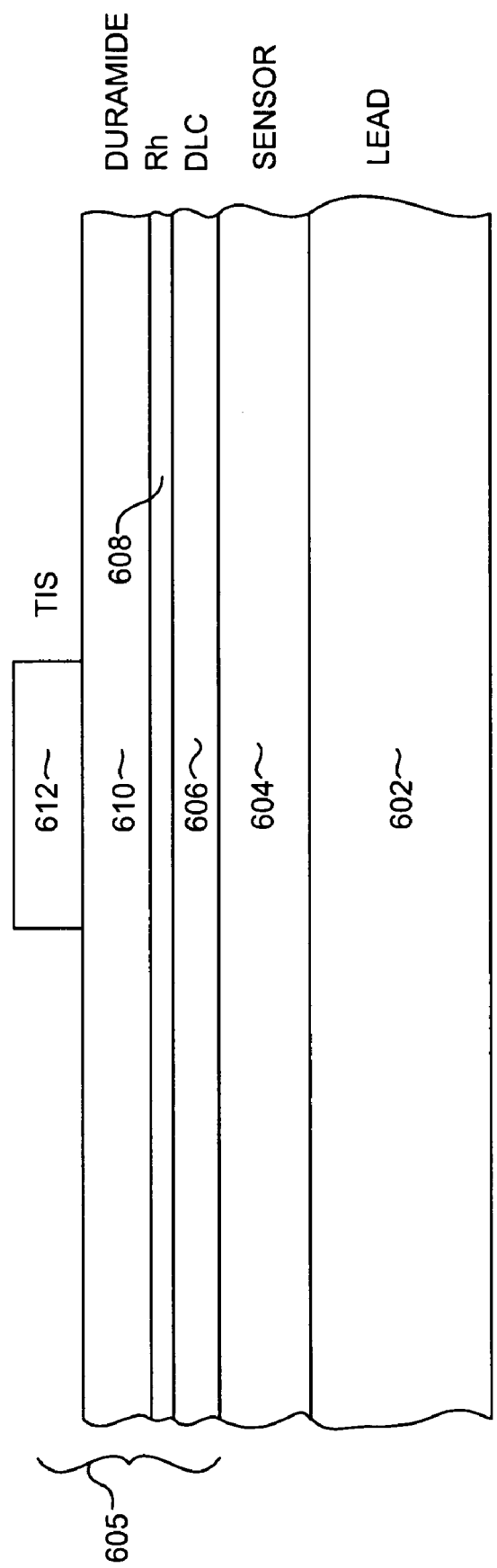
FIGS. 6-21 are views of a magnetoresitive sensor according to an embodiment of the invention, shown in various intermediate stages of manufacture to illustrate a method of manufacturing a device according to an embodiment of the present invention.

With reference still to FIG. 6 a track width defining mask structure 605 is then deposited by first depositing a layer of material that is resistant to chemical mechanical polishing (CMP resistant layer) 606. This material can be, for example diamond like carbon (DLC). Although other materials could be used, this CMP resistant layer 606 will be referred to as DLC layer 606.

Figure 7:
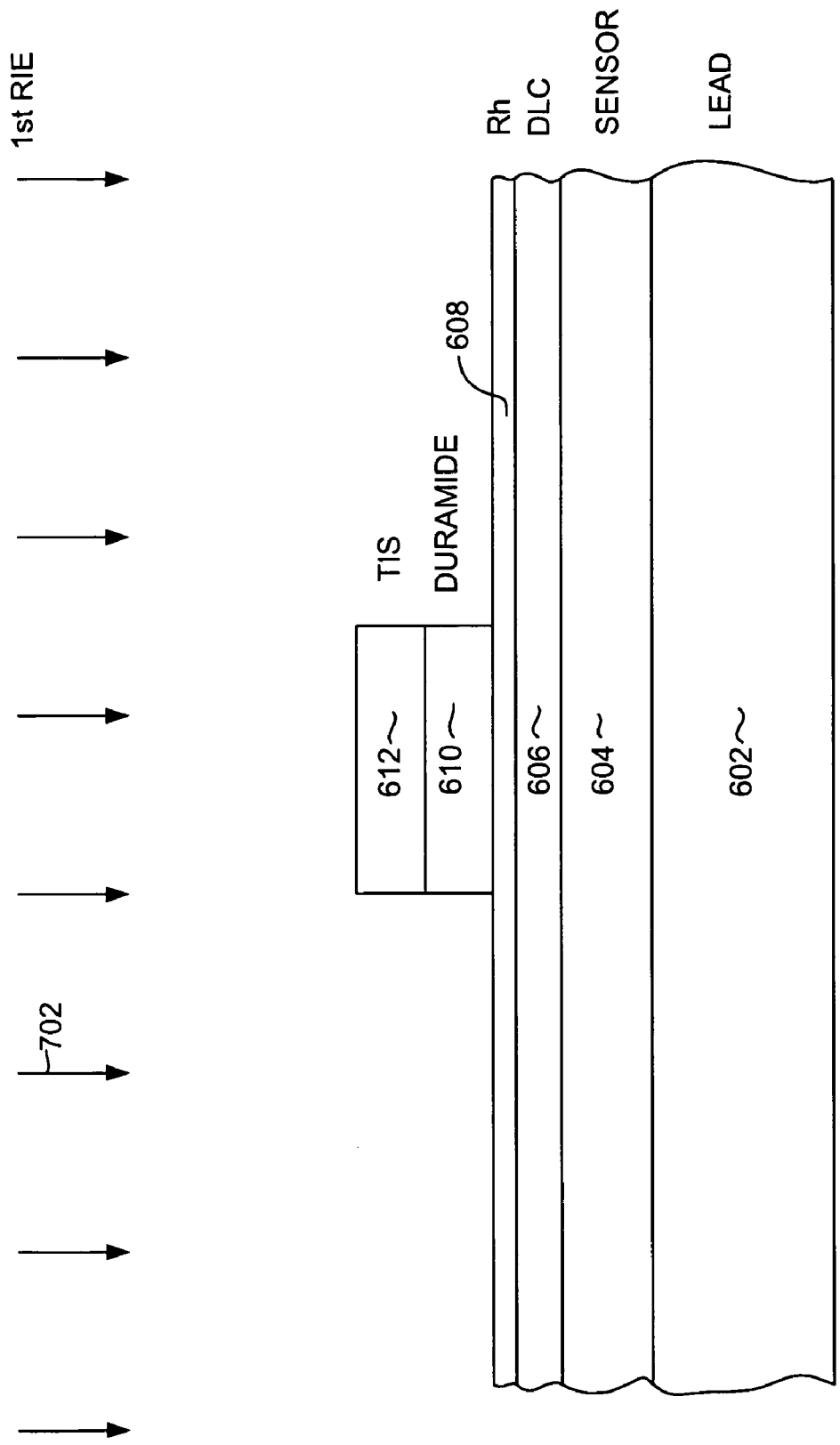
Figure 8:
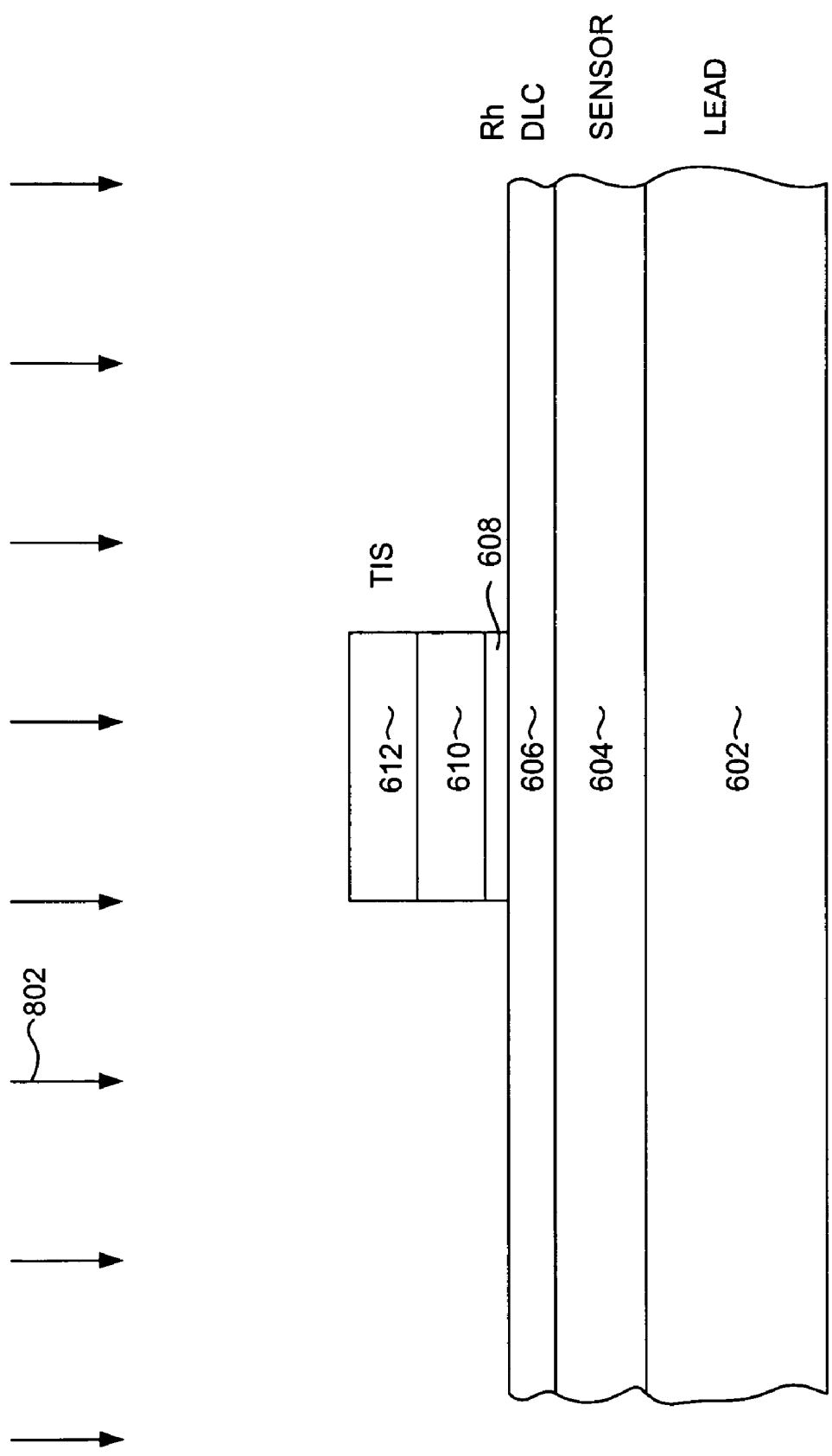
Figure 9:
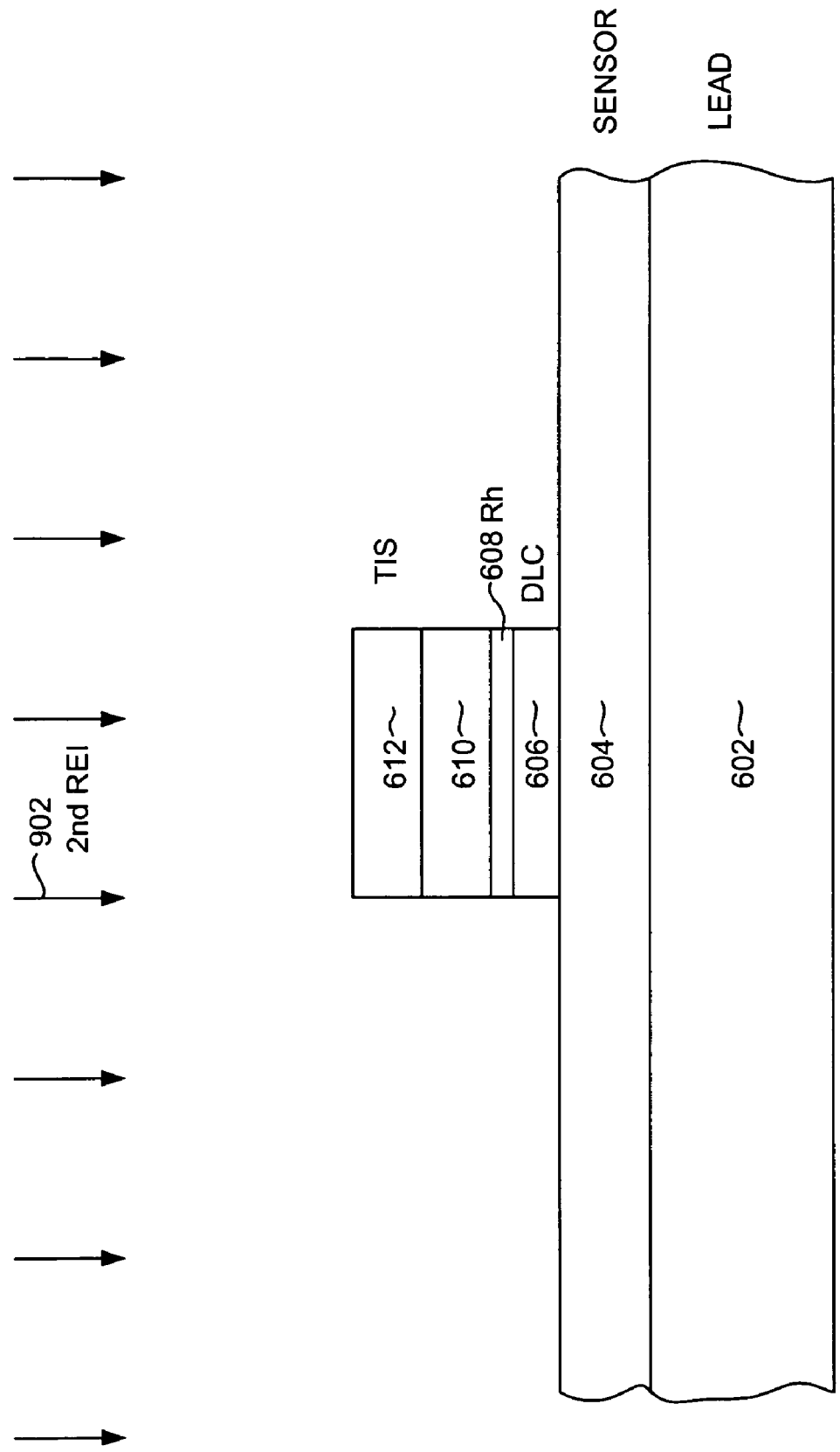

A layer of material 608 that is both resistant to removal by CMP and also resistant to removal by reactive ion etching (CMP resistant and RIE resistant) is then deposited full film over the DLC layer 608. Although several materials could be used as such a CMP resistant and RIE resistant layer 608, the layer 608 is preferably constructed of Rh, and will hereinafter be referred to as Rh layer 608. It should however be understood, that the layer 608 could be some material other than Rh. A transfer mask layer 610 such as DURIMIDE® is then deposited and a photosensitive mask such as TIS or photoresist 612 is then constructed to have a width to define the track width of the sensor. The photoresist mask 612 can be constructed according to methods that will be familiar to those skilled in the art, including spinning on a photoresist material and then patterning and developing the photoresist mask 612. With reference now to FIG. 7, a $1^{st}$ reactive ion etch, ($1^{st}$ RIE 702) is performed to transfer the image of the photoresist layer 612 onto the underlying non-photosensitive material 610. Then, with reference to FIG. 8, a first ion mill 802 is performed to remove portions of the Rh layer that are not protect by the overlying mask layers 610, 612. Thereafter, with reference to FIG. 9 a second RIE 902 is performed to remove portions of the DLC layer that are not protected by the overlying mask layers 608, 610, 612.

Figure 10:
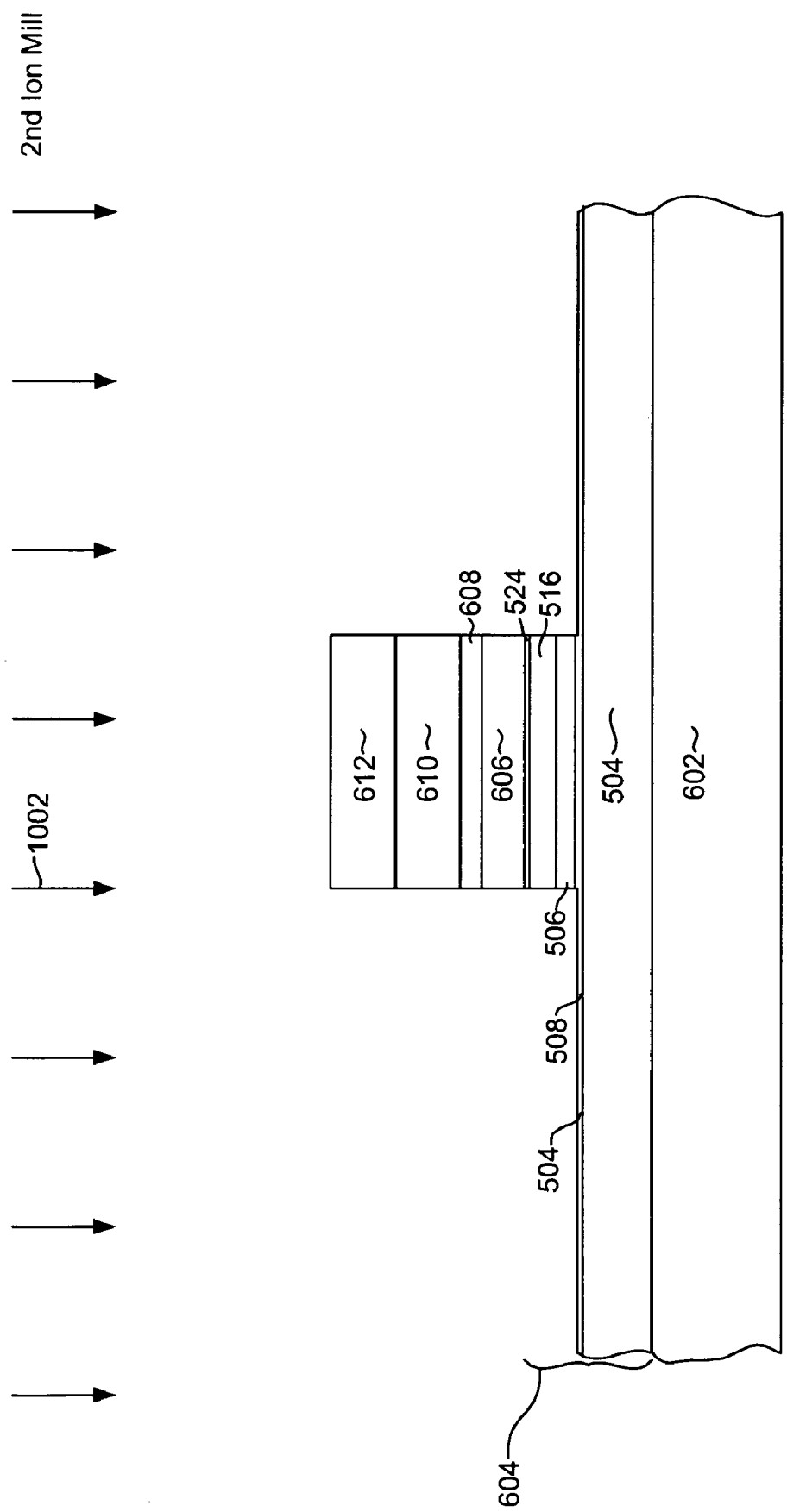

Although the other figures showed the sensor layers 604 as a single layer, FIG. 10 shows the individual sensor layers so that this partial mill can be more clearly understood. With reference now to FIG. 10 a second ion mill 1002 is performed, using mask layers 606-612 to define the track width of the sensor 300 (FIG. 3) by removing portions of the sensor material 604 that are not protected by the overlying mask layers 606-612. This is the first use of the mask structure 606-612, in which the mask is used to define the trackwidth of the sensor.

The ion mill 1002 is performed sufficiently to remove the in stack bias structure 516 and the free layer 506, but is preferably terminated before the pinned layer 504 has been removed. For example, the ion mill 1002 may be terminated when the spacer/barrier layer 508 has been reached. This is a partial mill process, wherein the track width is defined by the free layer, and the pinned layer and underlying AFM (if one is present) are left intact.

Figure 11:
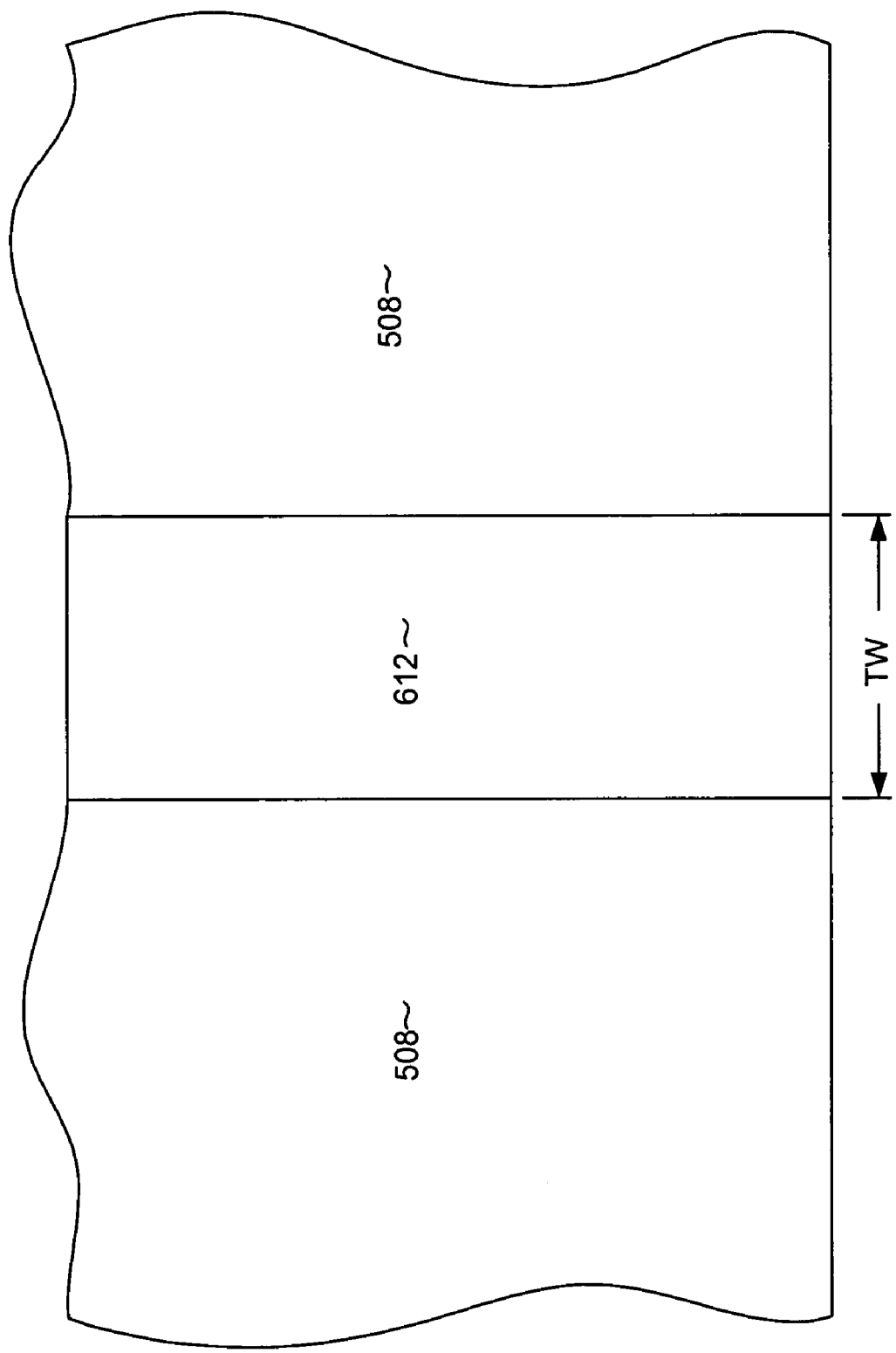

FIG. 11, which shows a top down view of the structure described in FIG. 10, shows that the pattern defined in the sensor and mask layers 602-612 extends a substantial amount in the stripe height direction.

Figure 12:
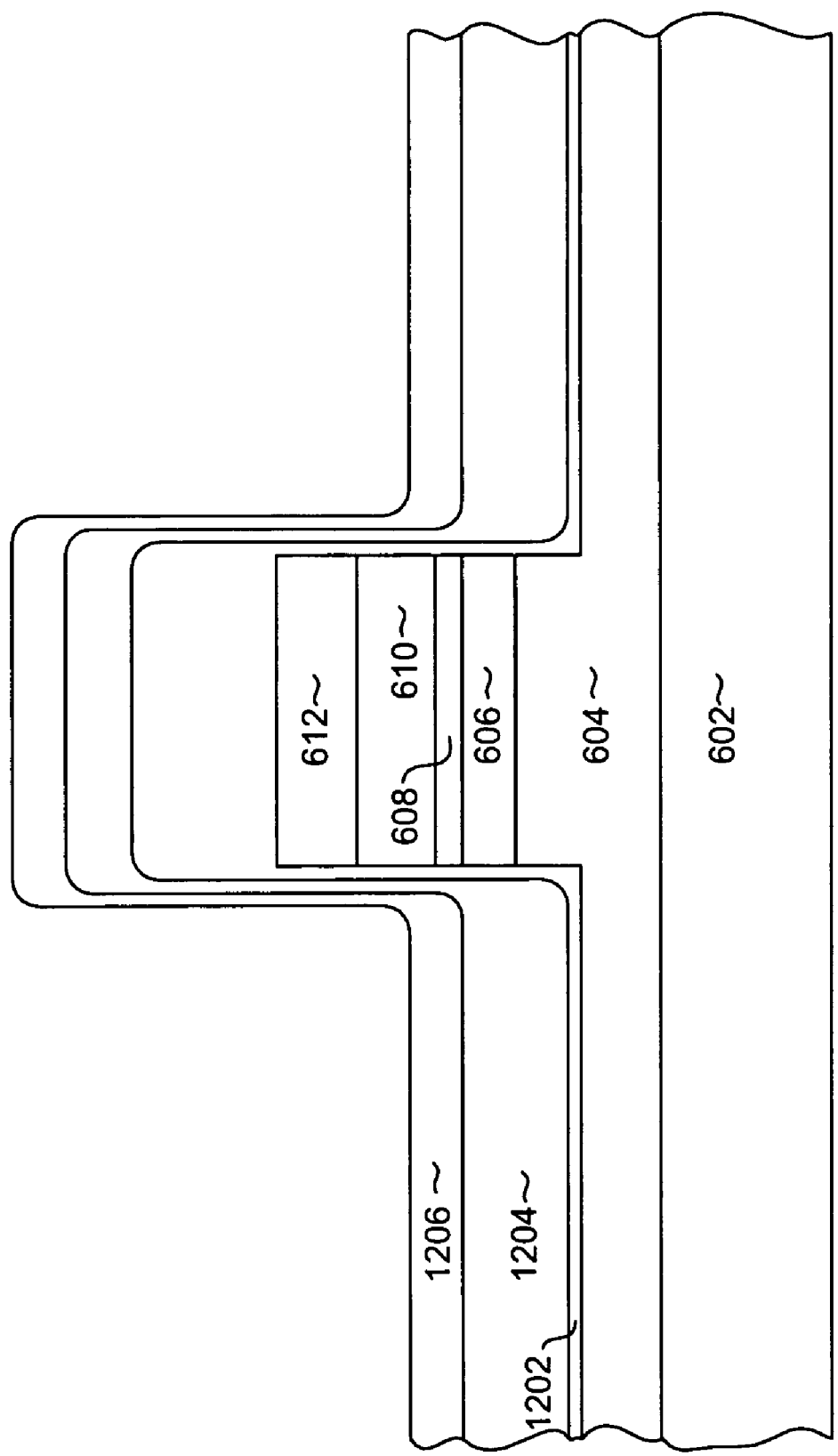

With reference now to FIG. 12, a thin layer of non-magnetic, electrically insulating material 1202 is deposited, preferably by a conformal deposition process such as atomic layer deposition, chemical vapor deposition, etc. The insulation layer 1202 can be, for example alumina ($Al_2O_3$) or some other material. A layer of magnetic material 1204 (for magnetic shielding) is then deposited over the insulation layer 1202. The shield material 1204 can be for example NiFe or some other suitable material. A second layer of CMP resistant material ($2^{nd}$ DLC layer) 1206 is then deposited over the insulation and shield layers 1202, 1204. Optionally, the shielding material 1204 can be eliminated and insulation layer 1202 can be deposited to the level of the top of sensor layers 604.

Figure 13:
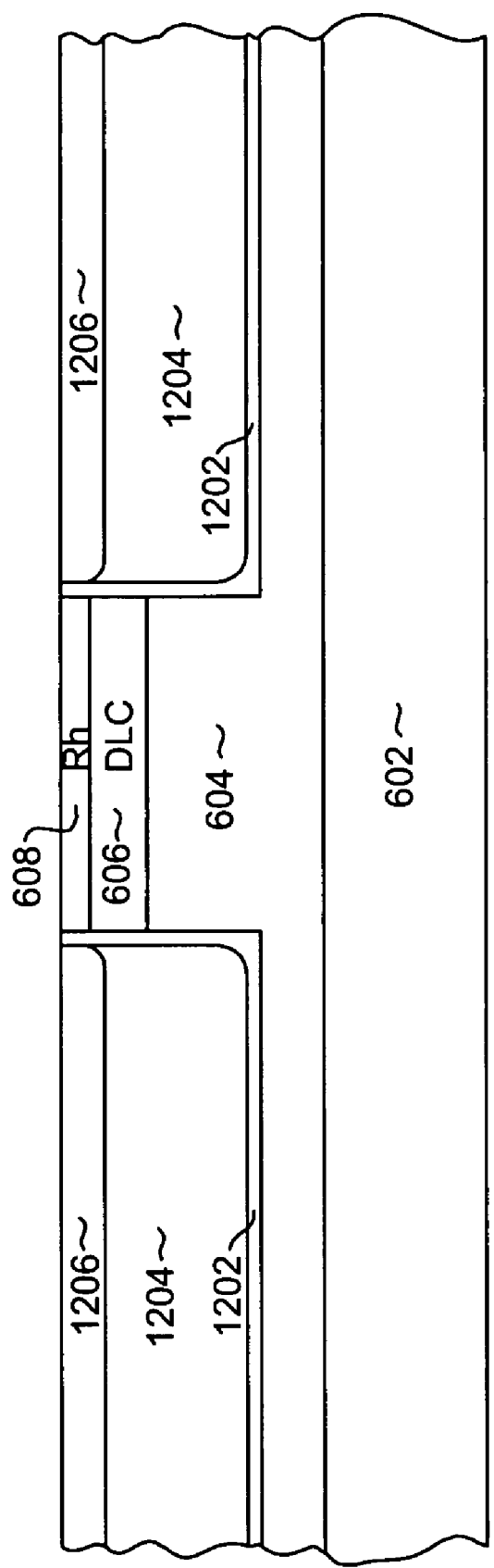

With reference now to FIG. 13, a chemical mechanical polishing process (CMP) is performed. The CMP removes the tall topography of the mask structure, planarizing the deposited structure down to the level of the Rh layer 608 and the second DLC layer 1206. The Rh layer 608 acts as a CMP stop layer that protects the sensor layers 604 from the CMP process, and the second DLC layer 1206 protects the insulation layer 1202 and magnetic shielding material 1204.

Figure 14:
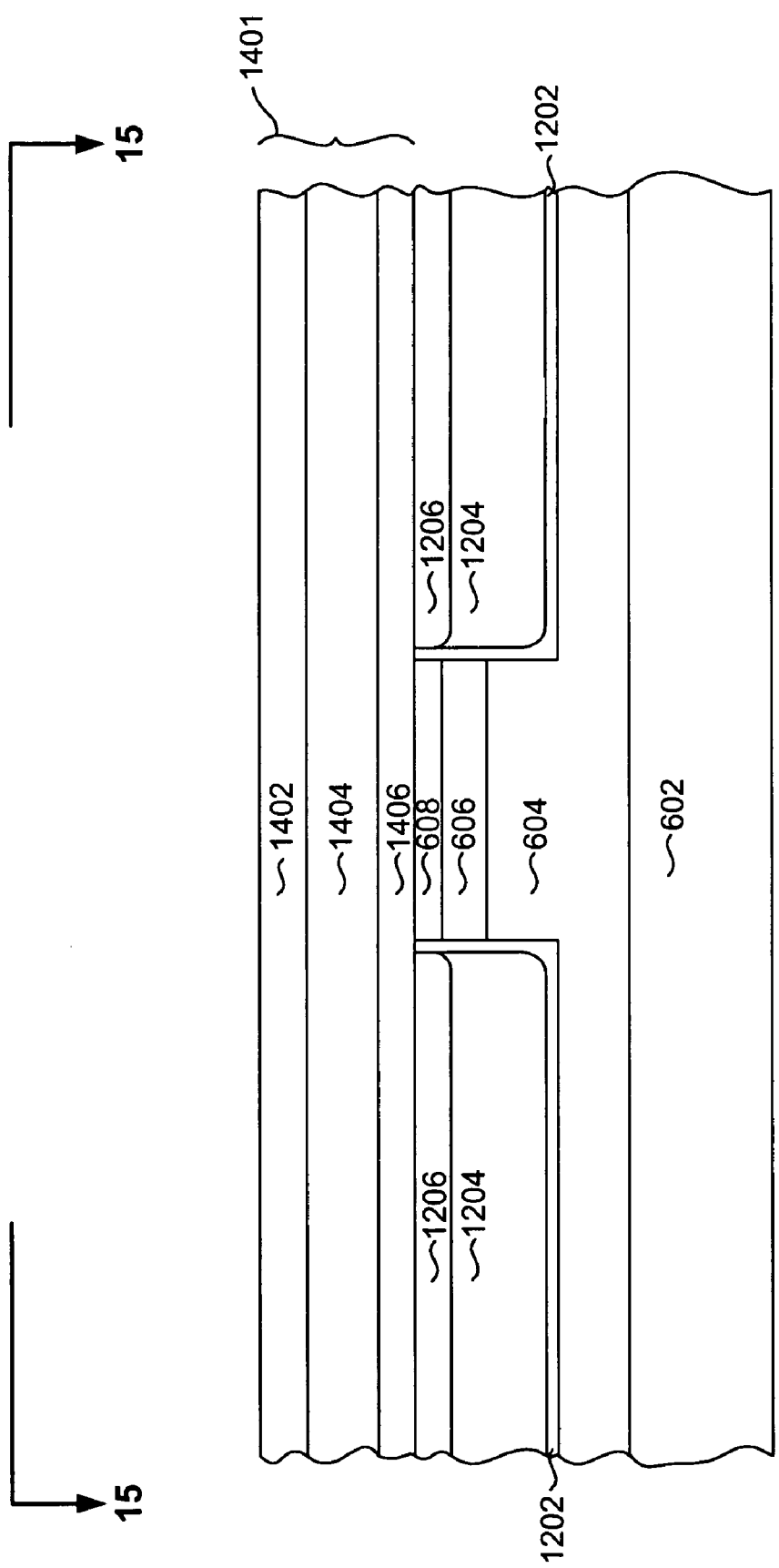
Figure 15:
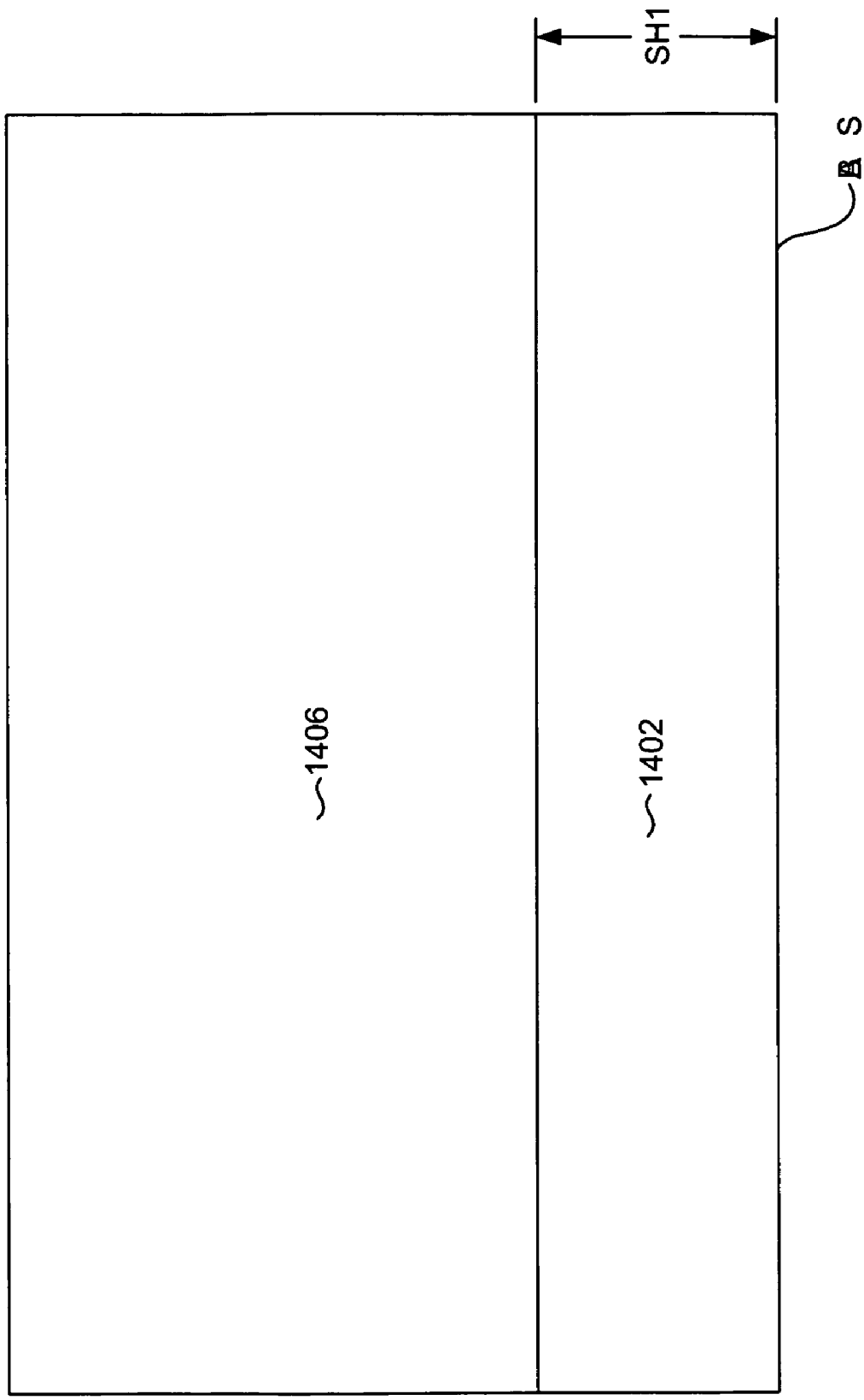

With reference to FIGS. 14 and 15, a second mask structure 1401 is formed. The mask structure preferably includes patterned TIS layer 1402 such as photoresist and an image transfer layer 1404 such as DURAMIDE. A third CMP resistant layer ($3^{rd}$ DLC layer) 1406 may also be deposited as a full film layer, beneath the image transfer layer 1404 and TIS 1402. This second mask structure 1401 is constructed to define the stripe height of the active area of the sensor by defining the stripe height of the free layer. In other words it covers the area from the ABS (future ABS location) to SH1. This can be seen more clearly with reference to FIG. 15.

Figure 16:
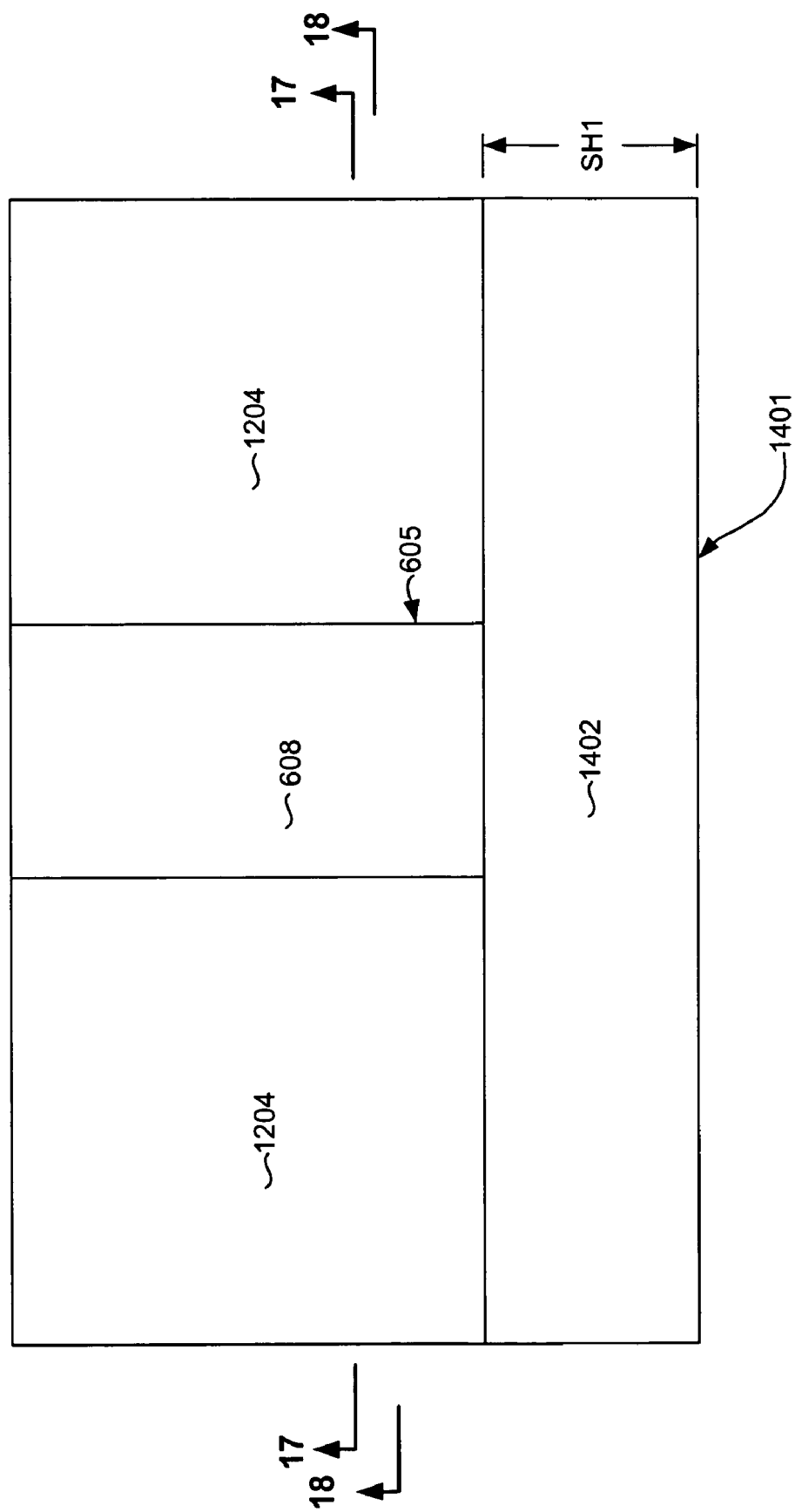
Figure 17:
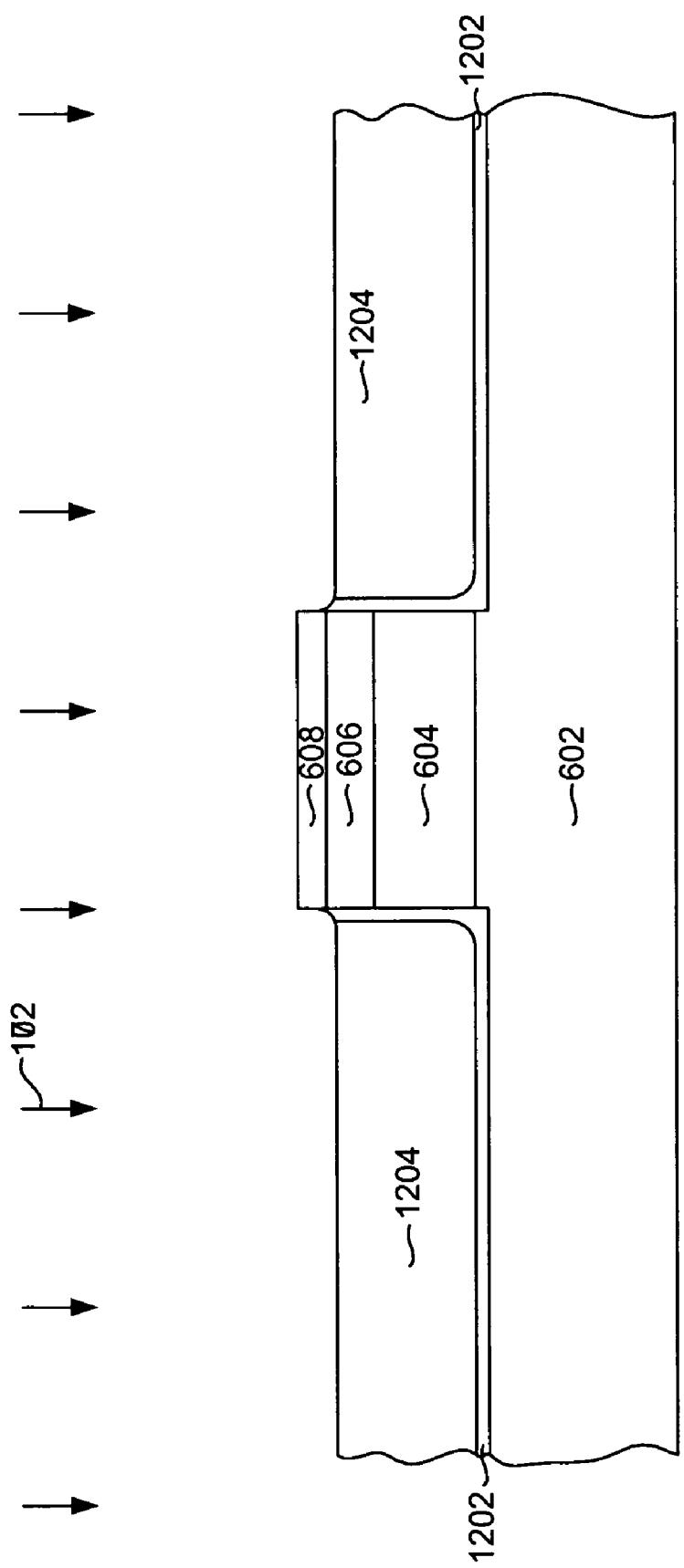

With reference now to FIGS. 16 and 17, a third reactive ion etch (RIE) 1702 is performed. This third RIE 1702 removes the second and third DLC layers 1206, 1406 from the area over the magnetic shielding material 1204. This third RIE 1702 does not, however, remove the Rh layer 608, because Rh layer 608 is resistant to removal by RIE. As mentioned before, use of Rh for the RIE/CMP resistant layer 608 is by way of example, and other materials could be used.

Figure 18:
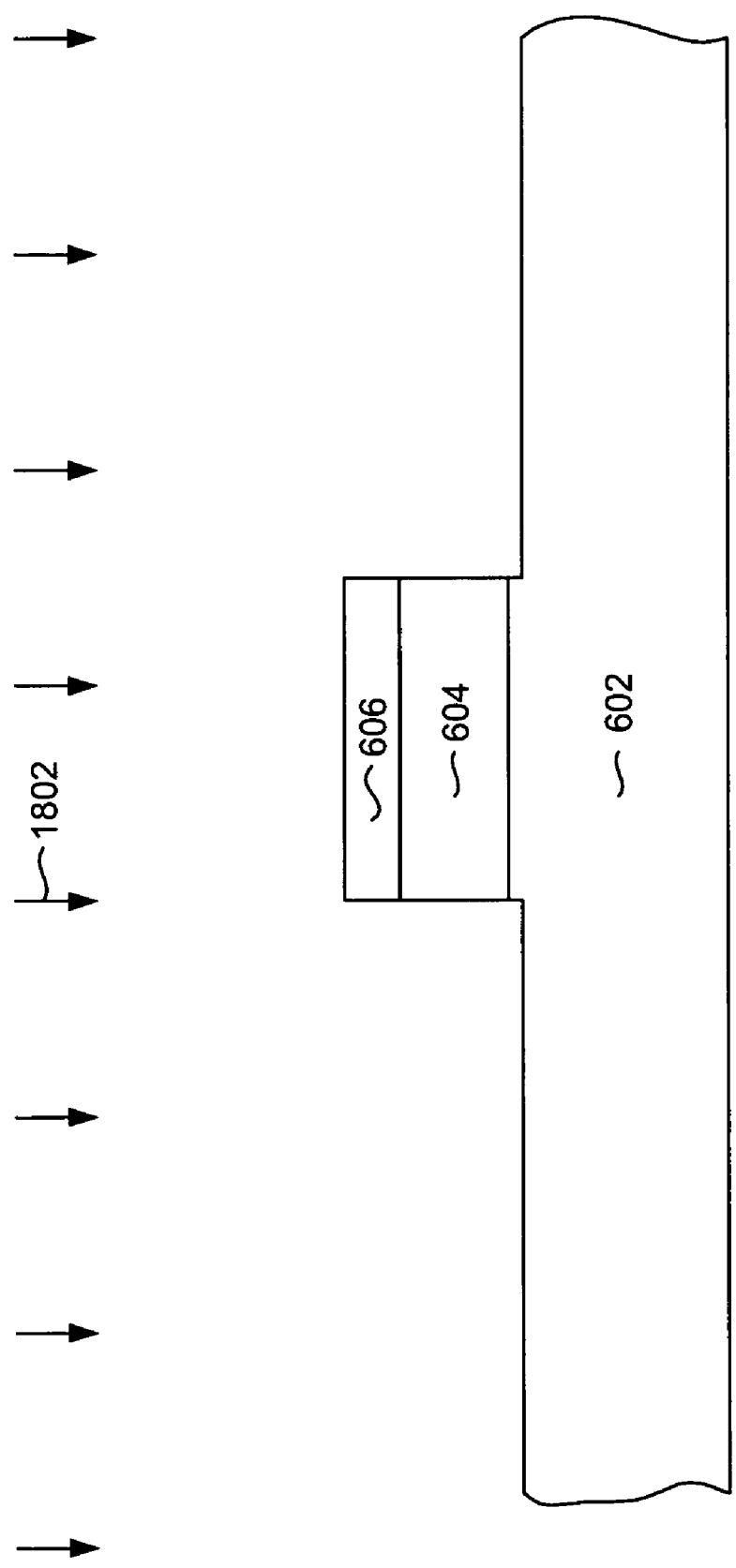
Figure 19:
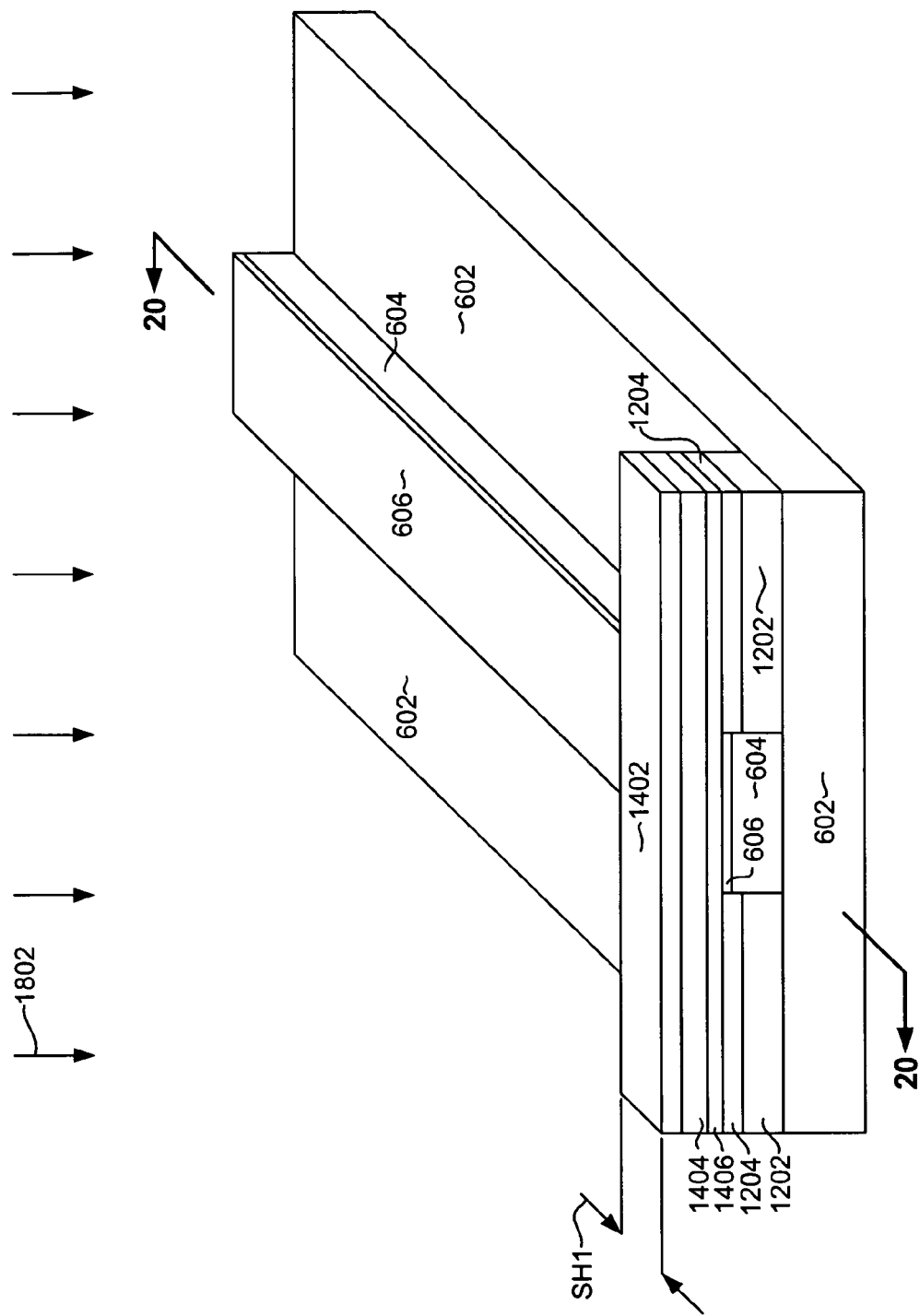

With reference now to FIG. 18, a third ion mill 1802 is performed. This ion mill 1802 removes magnetic shield and insulation material 1202, 1204 from the areas not covered by either of the first and second mask structures (605, 1401) (FIG. 17). This ion mill 1802 also removes the remaining sensor material 604 (ie. the pinned layers 504 and any remaining spacer material 508) from the areas not covered by either of the first and second mask structures. Therefore, shield and insulation layers 1202, 1204 and pinned layer 504 are removed only from areas beyond SH1 (ie beyond the stripe height of the free layer as will be described below) and also outside of the trackwidth (TW). The third ion mill 1802 also removes most or all of the Rh layer 608, leaving the first DLC layer 606 exposed. With reference to FIG. 19 it can be seen that the second mask structure 1402, 1404 is still in place so the insulation and shield layers 1202, 1204 are unaffected by the third ion mill 1802 in areas adjacent to the active area of the sensor (between the ABS and SH1). FIG. 19 shows an isometric view of the structure thus far, which may better illustrate the structure.

Figure 20:
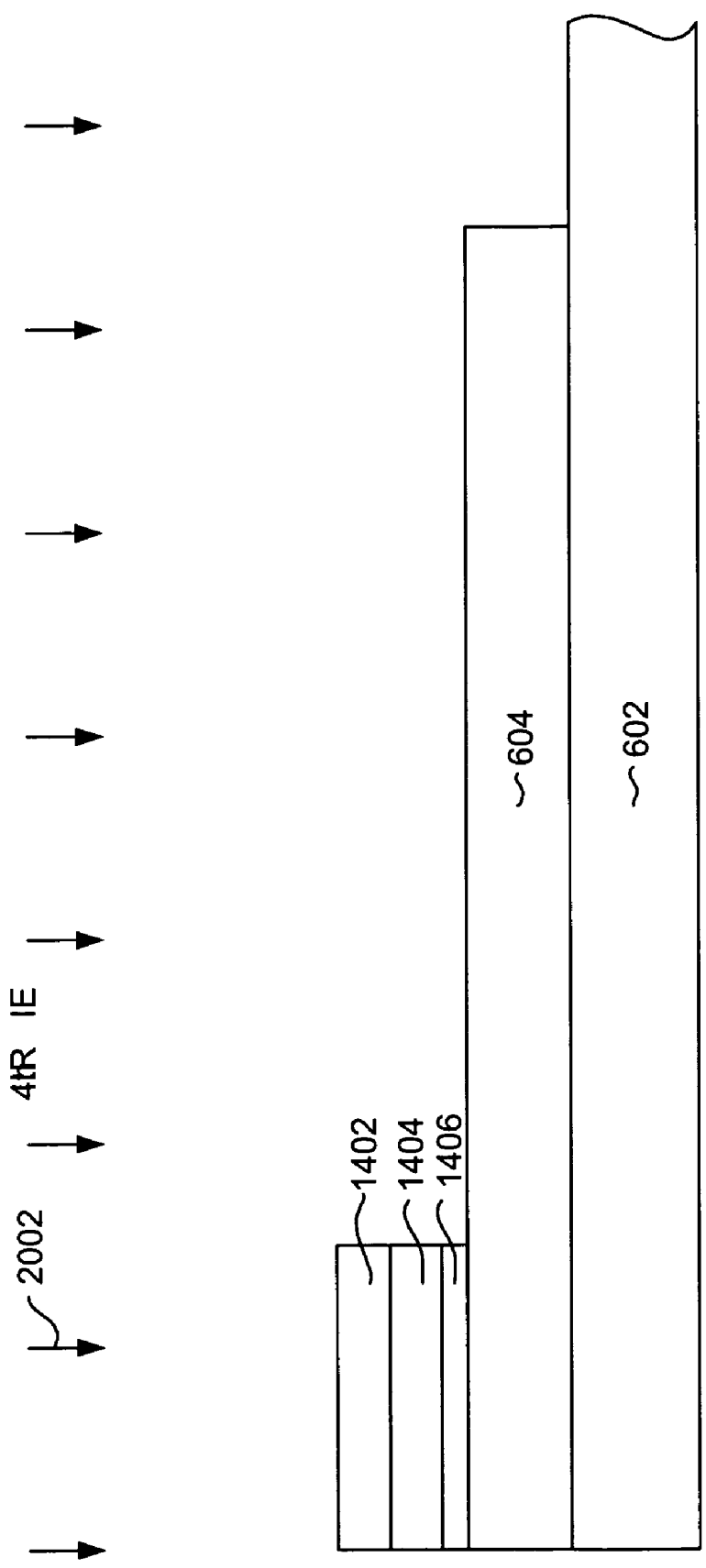

With reference now to FIG. 20 a fourth RIE 2002 is performed to remove the first CMP layer 606 from over the sensor layers 604 in the area beyond SH1. With the third CMP layer 1406 removed during the third RIE 1302 and the Rh layer 608 removed during the previous ion mill process 1802, the CMP layer 606 can be readily removed by RIE 2002.

Figure 21:
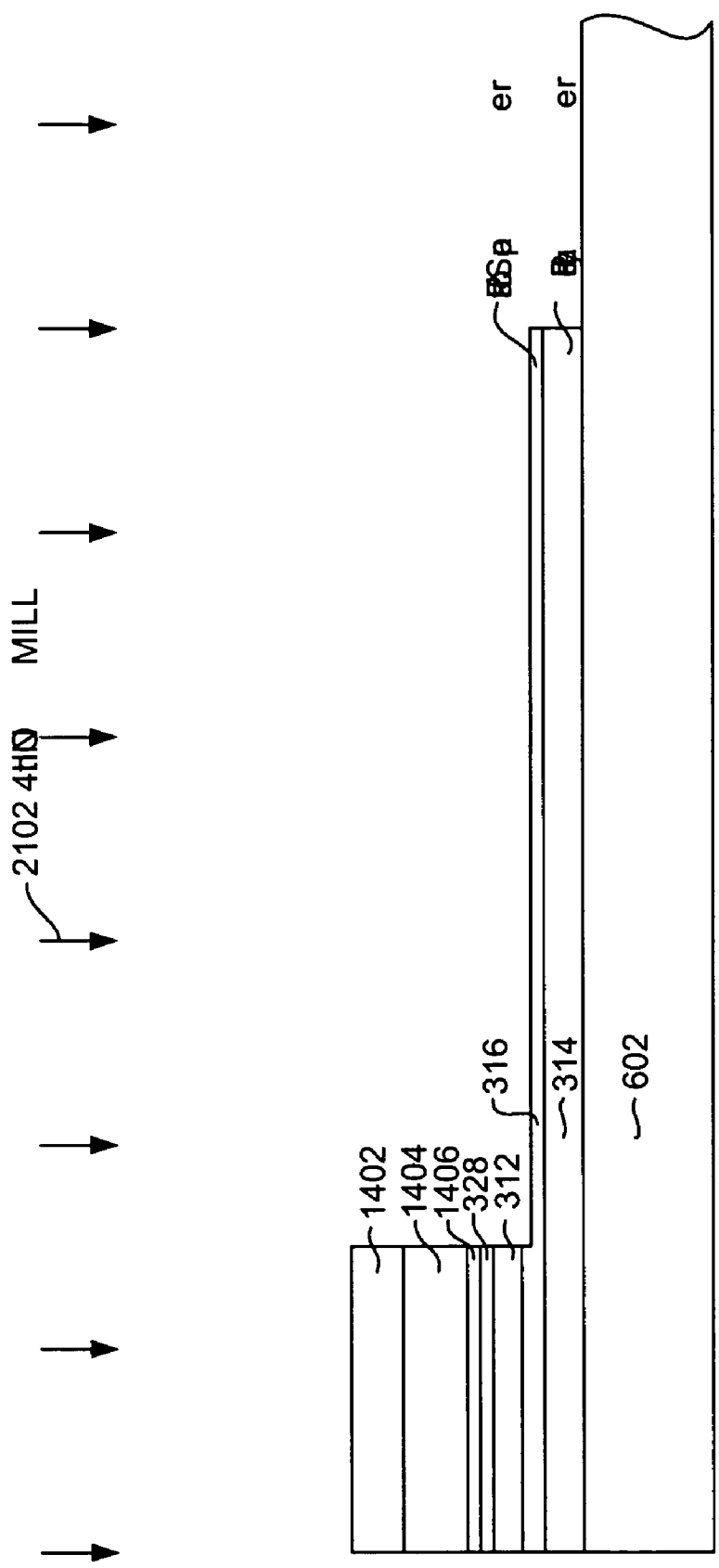

With reference now to FIG. 21, a fourth ion mill process 2102 can be performed to remove selected portions of the sensor layer 604. The ion mill process 2102 can be performed sufficiently to remove the free layer 312 (FIGS. 3, 4) but can be terminated before removing the pinned layer structure 314. The fourth ion mill process 2102 can be performed sufficiently to leave all or a portion of the spacer 316 intact in the area beyond SH1. An insulation fill layer (538 FIGS. 5B, 5C), can then be deposited to fill the areas removed during the third and fourth ion mills 1802, 2102.

A masking and ion milling process may also be performed to defined the further back stripe height (SH2) of the extended pinned layer 504. As this masking and milling operation will be familiar to those skilled in the art, a more detailed description is not given here. This SH2 defining mask and milling process can also be performed either before or after the processes described above, with reference to FIGS. 6-21.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor having an air bearing surface (ABS), the magnetoresistive sensor comprising:
   a magnetic free layer, extending to a first stripe height distance measured from the ABS;
   a magnetic pinned layer structure extending to a second stripe height distance that is larger than the first stripe height distance as measured from the ABS;
   a first non-magnetic, electrically conductive spacer layer sandwiched between the free layer and the pinned layer structure; and
   an in stack bias structure formed adjacent to the magnetic free layer opposite the first non-magnetic, electrically conductive spacer layer;
   wherein the pinned layer structure includes first and second magnetic layers that are antiparallel coupled with on another across a non-magnetic, electrically conductive antiparallel coupling layer, and wherein one of the first and second magnetic layers in exchange coupled with a layer of antiferromagnetic material, and wherein both of the first and second magnetic layers extend beyond the first stripe height distance.

2. A sensor as in claim 1, wherein the pinned layer has an extended portion that extends beyond the first stripe height distance SH1 to the second stripe height distance SH2 and wherein the pinned layer structure has a width in the extended portion that is substantially equal to a width of the free layer.

3. A sensor as in claim 1, wherein the pinned layer has a width that is substantially equal to a width of the free layer.

4. A sensor as in claim 1, wherein:
   the free layer has a lateral width that defines a track width of the sensor;
   the sensor has an active area between the ABS and SH1 and an inactive area beyond SH1; and
   the pinned layer extends laterally beyond the trackwidth of the sensor.

5. A sensor as in claim 4 wherein the pinned layer has a width outside of the active area of the sensor (in a stripe height direction measured from the ABS) that is substantially equal to the trackwidth of the sensor.

6. A sensor as in claim 4 wherein the pinned layer extends laterally beyond the trackwidth of the sensor a distance at least twice the trackwidth of the sensor.

7. A sensor as in claim 4 wherein the pinned layer structure extends laterally indefinitely beyond the trackwidth of the sensor.

8. A sensor as in claim 4 wherein the pinned layer has a width beyond SH1 that is larger than the trackwidth of the sensor.

9. A sensor as in claim 1 wherein the pinned layer structure comprises first and second magnetic layers (AP1 and AP2) and a non-magnetic, electrically conductive antiparallel coupling layer sandwiched between the AP1 and AP2 layers, the AP1 and AP2 layers being antiparallel coupled with one another, wherein the AP1 and AP2 layers are constructed of material having a positive magnetostricion, and wherein the magnetizations of the AP1 and AP2 layers are pinned without exchange coupling with a layer of antiferromagnetic material.

10. A sensor as in claim 1 wherein the in stack bias layer comprises:
    a magnetic bias layer;
    a second non-magnetic, electrically conductive spacer layer sandwiched between the bias layer and the free layer; and
    a layer of antiferromagnetic material exchange coupled with the bias layer.

11. A sensor as in claim 10 wherein the bias layer has a magnetization that is pinned in a first direction parallel with the ABS, and the free layer has a magnetization that is biased in a second direction antiparallel with the first direction.

12. A sensor as in claim 10 wherein the bias layer has a magnetization that is pinned in a direction parallel with the ABS and the free layer is magnetostatically coupled with the bias layer.

13. A disk drive data storage system, comprising:
    a housing;
    a magnetic disk, rotatably mounted within the housing;
    an actuator, pivotally mounted within the housing;
    a slider connected with the actuator for movement adjacent to a surface of the magnetic disk;
    a current perpendicular to plane CPP magnetoresisitive sensor connected with the slider and having an air bearing surface (ABS), the sensor comprising:
      a magnetic free layer, extending to a first stripe height distance measured from the ABS;
      a magnetic pinned layer structure extending to a second stripe height distance that is larger than the first stripe height distance as measured from the ABS;
      a non-magnetic, layer sandwiched between the free layer and the pinned layer; and
      an in stack bias structure formed adjacent to the magnetic free layer opposite the first non-magnetic, electrically conductive spacer layer;
      wherein the pinned layer structure includes first and second magnetic layers that are antiparallel coupled with on another across a non-magnetic, electrically conductive antiparallel coupling layer, and wherein one of the first and second magnetic layers in exchange coupled with a layer of antiferromagnetic material, and wherein both of the first and second magnetic layers extend beyond the first stripe height distance.

14. A disk drive system as in claim 13 wherein the wherein the pinned layer has an extended portion that extends beyond the first stripe height distance SH1 to the second stripe height distance SH2 and wherein the pinned layer structure has a width in the extended portion that is substantially equal to a width of the free layer.

15. A disk drive system as in claim 13 wherein the pinned layer has a width that is substantially equal to a width of the free layer.

16. A disk drive system as in claim 13, wherein:
    the free layer has a lateral width that defines a track width of the sensor;
    the sensor has an active area between the ABS and SH1 and an inactive area beyond SH1; and
    the pinned layer extends laterally beyond the trackwidth of the sensor.

17. A disk drive system as in claim 16, wherein the pinned layer has a width outside of the active area of the sensor that is substantially equal to the trackwidth of the sensor.

18. A disk drive system as in claim 16, wherein the pinned layer extends laterally beyond the trackwidth of the sensor a distance at least twice the trackwidth of the sensor in the active area of the sensor.

19. A disk drive system as in claim 16, wherein the pinned layer structure extends laterally indefinitely beyond the trackwidth of the sensor in the active area of the sensor.

20. A disk drive system as in claim 13 wherein the non-magnetic layer sandwiched between the free layer and the pinned layer is an electrically conductive spacer layer and the sensor is a current perpendicular to plane (CPP) giant magnetoresistive (GMR) sensor.

21. A disk drive system as in claim 13 wherein the non-magnetic layer sandwiched between the free layer and the pinned layer is an electrically insulating barrier layer and the sensor is a tunnel valve sensor.

* * * * *